US009613850B2

(12) United States Patent
Yen et al.

(10) Patent No.: US 9,613,850 B2
(45) Date of Patent: Apr. 4, 2017

(54) LITHOGRAPHIC TECHNIQUE FOR FEATURE CUT BY LINE-END SHRINK

(71) Applicant: Taiwan Semiconductor Manufacturing Company, Ltd., Hsin-Chu (TW)

(72) Inventors: Yung-Sung Yen, New Taipei (TW); Chun-Kuang Chen, Hsinchu County (TW); Ko-Bin Kao, Taichung (TW); Ken-Hsien Hsieh, Taipei (TW); Ru-Gun Liu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/835,495

(22) Filed: Aug. 25, 2015

(65) Prior Publication Data

US 2016/0181110 A1  Jun. 23, 2016

Related U.S. Application Data

(60) Provisional application No. 62/094,759, filed on Dec. 19, 2014.

(51) Int. Cl.
| | |
|---|---|
| *H01L 21/308* | (2006.01) |
| *H01L 21/768* | (2006.01) |
| *H01L 21/027* | (2006.01) |
| *H01L 21/033* | (2006.01) |
| *H01L 21/311* | (2006.01) |

(52) U.S. Cl.
CPC .... *H01L 21/76802* (2013.01); *H01L 21/0273* (2013.01); *H01L 21/0337* (2013.01); *H01L 21/31144* (2013.01); *H01L 21/76877* (2013.01)

(58) Field of Classification Search
None
See application file for complete search history.

(56) References Cited

U.S. PATENT DOCUMENTS

| | | | |
|---|---|---|---|
| 6,034,403 | A | 3/2000 | Wu |
| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |

(Continued)

*Primary Examiner* — Fernando L Toledo
*Assistant Examiner* — Valerie N Newton
(74) *Attorney, Agent, or Firm* — Haynes and Boone, LLP

(57) ABSTRACT

A technique for patterning a workpiece such as an integrated circuit workpiece is provided. In an exemplary embodiment, the method includes receiving a dataset specifying a plurality of features to be formed on the workpiece. A first patterning of a hard mask of the workpiece is performed based on a first set of features of the plurality of features, and a first spacer material is deposited on a sidewall of the patterned hard mask. A second patterning is performed based on a second set of features, and a second spacer material is deposited on a sidewall of the first spacer material. A third patterning is performed based on a third set of features. A portion of the workpiece is selectively processed using a pattern defined by a remainder of at least one of the patterned hard mask layer, the first spacer material, or the second spacer material.

20 Claims, 28 Drawing Sheets

(56) References Cited

U.S. PATENT DOCUMENTS

| | | |
|---|---|---|
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 2012/0208361 A1* | 8/2012 | Ha .................... H01L 21/0337 438/597 |
| 2014/0001574 A1 | 1/2014 | Chen et al. |
| 2014/0110755 A1 | 4/2014 | Colinge |
| 2014/0151812 A1 | 6/2014 | Liaw |

\* cited by examiner

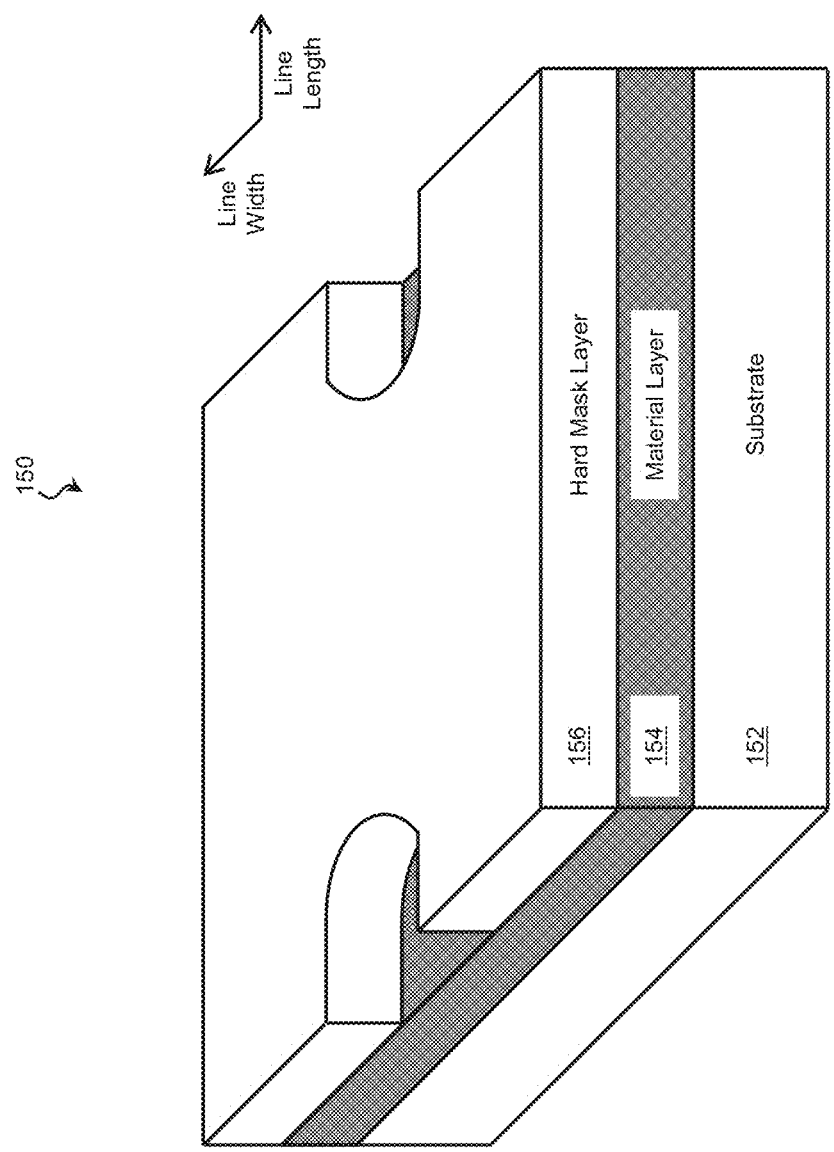

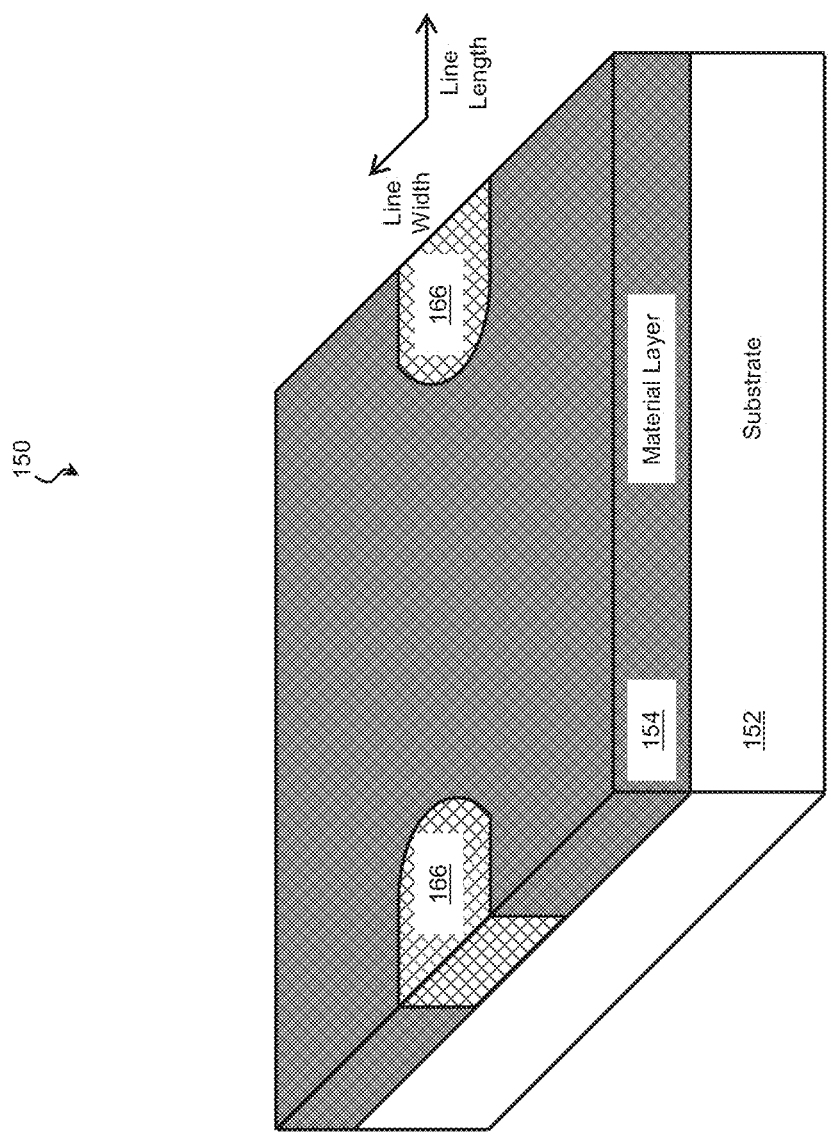

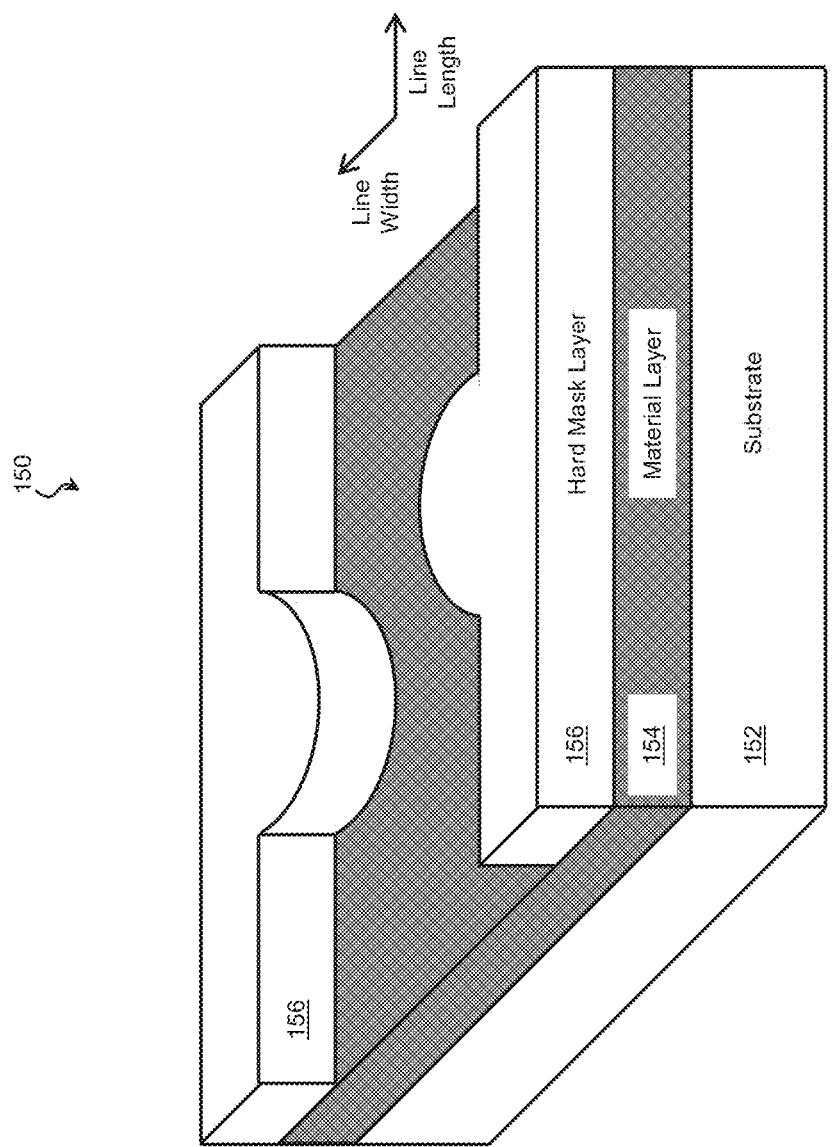

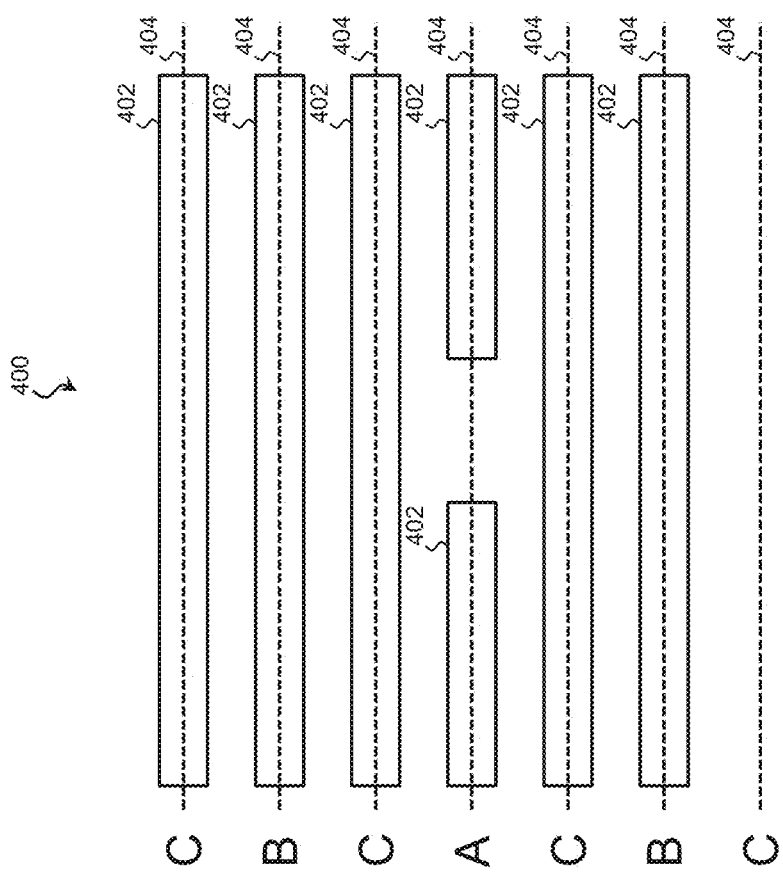

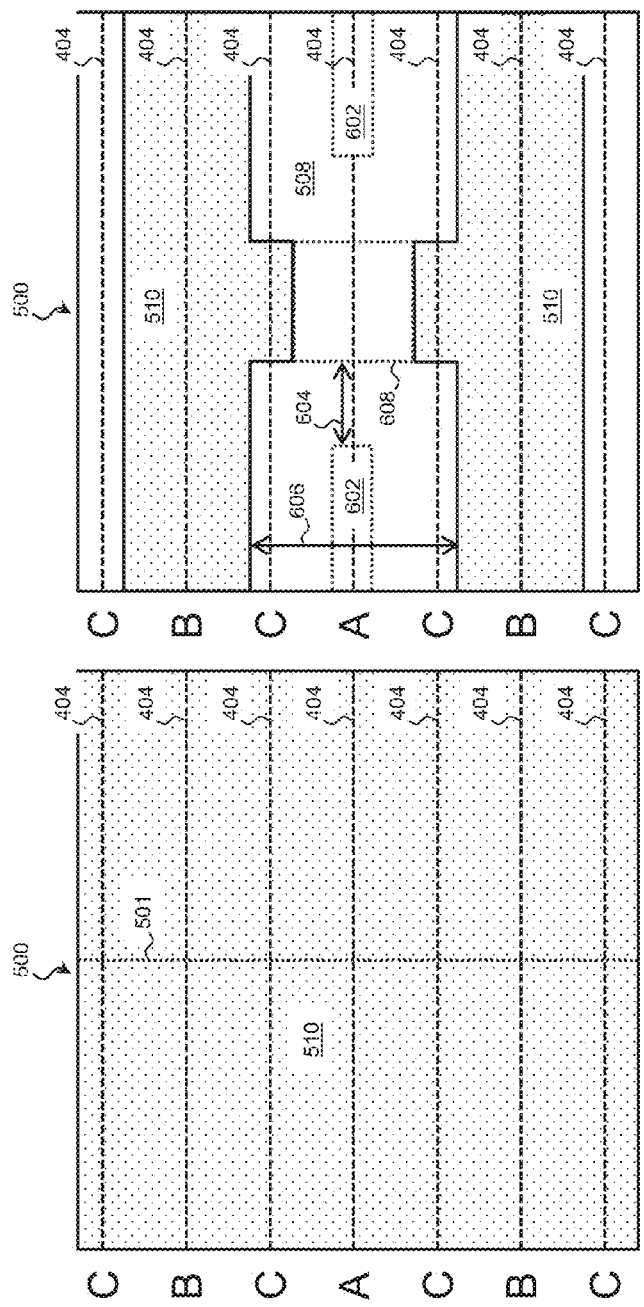
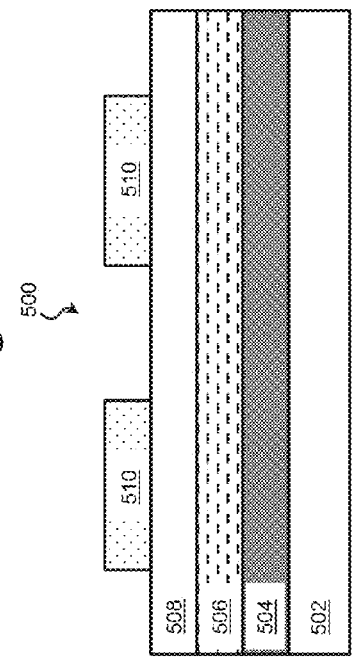
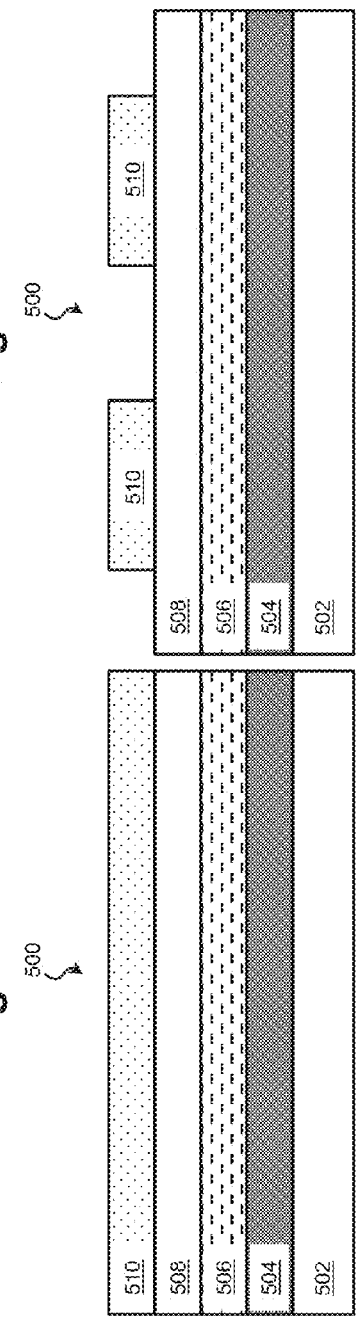
Fig. 5A
Fig. 5B
Fig. 6A
Fig. 6B

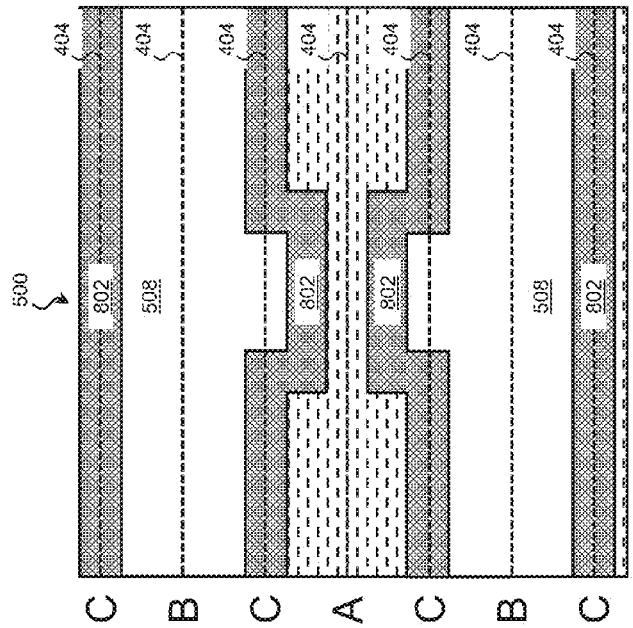
Fig. 7A
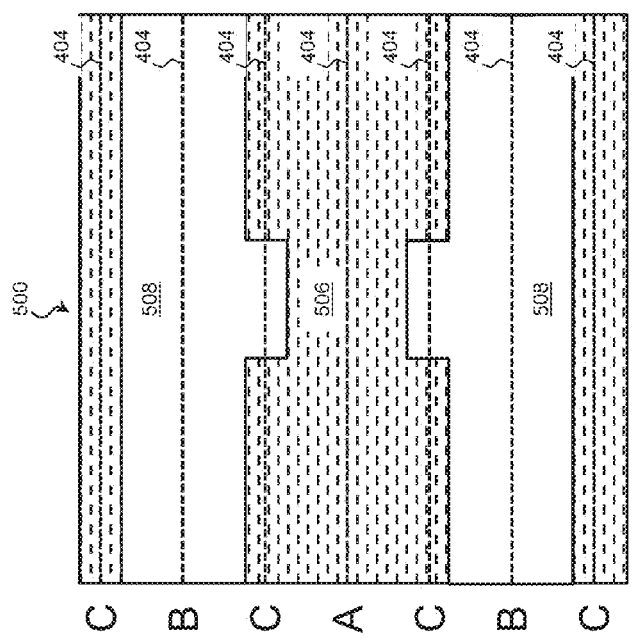
Fig. 8A
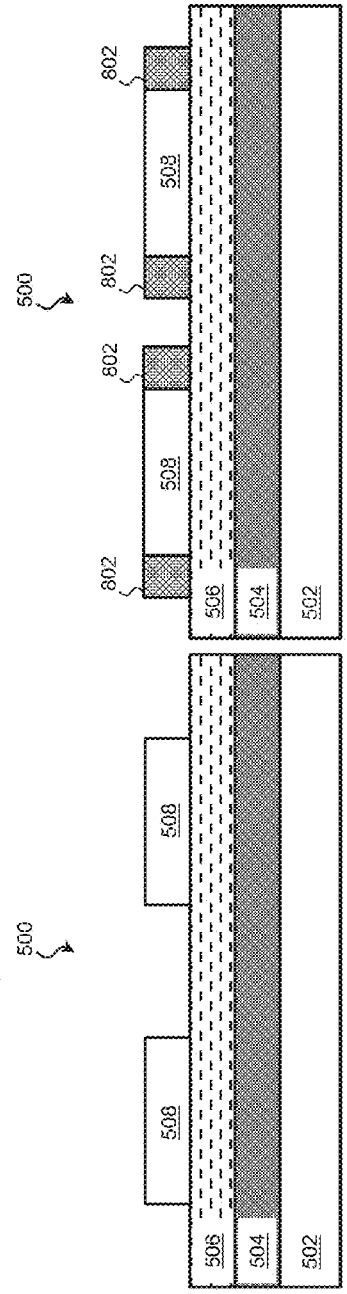
Fig. 7B
Fig. 8B

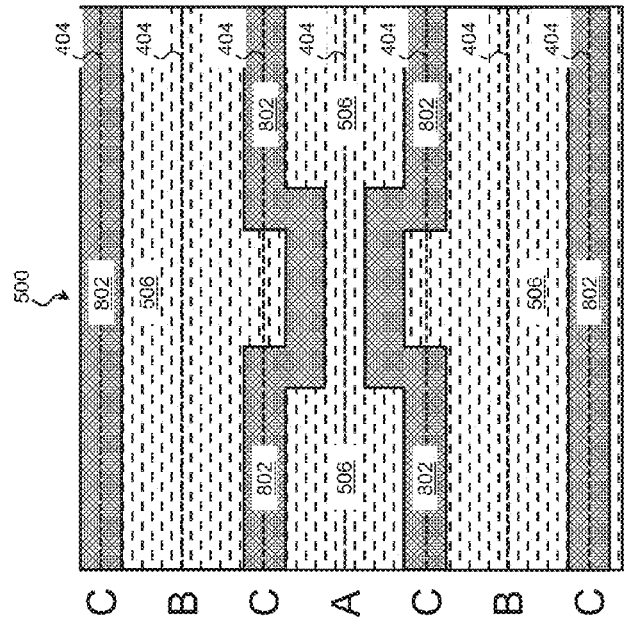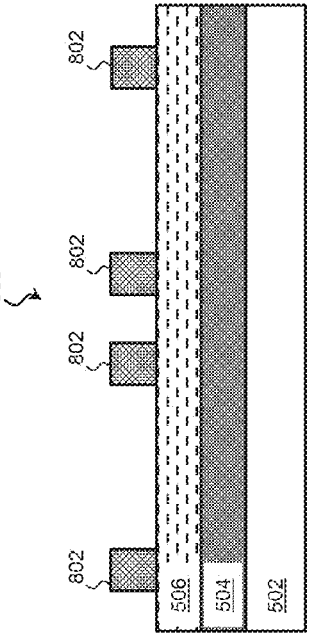
Fig. 9A
Fig. 9B
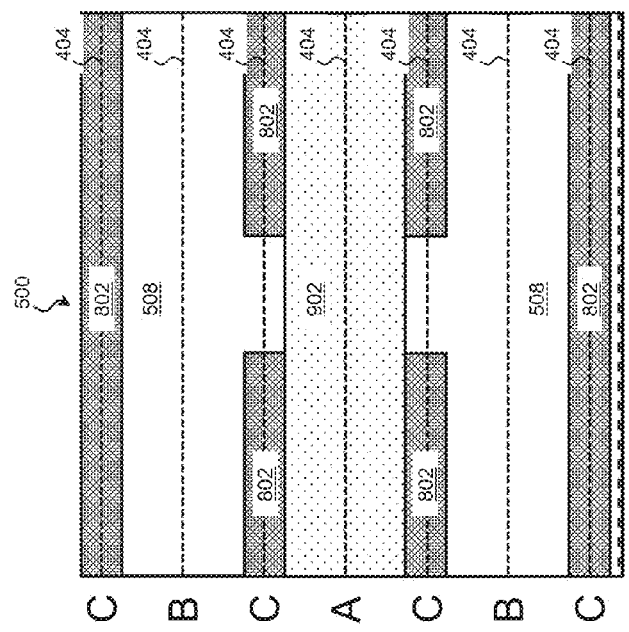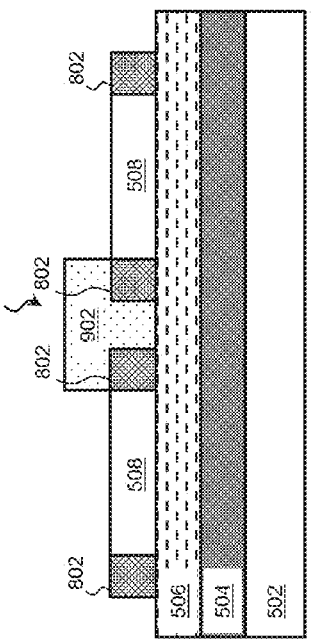
Fig. 10A
Fig. 10B

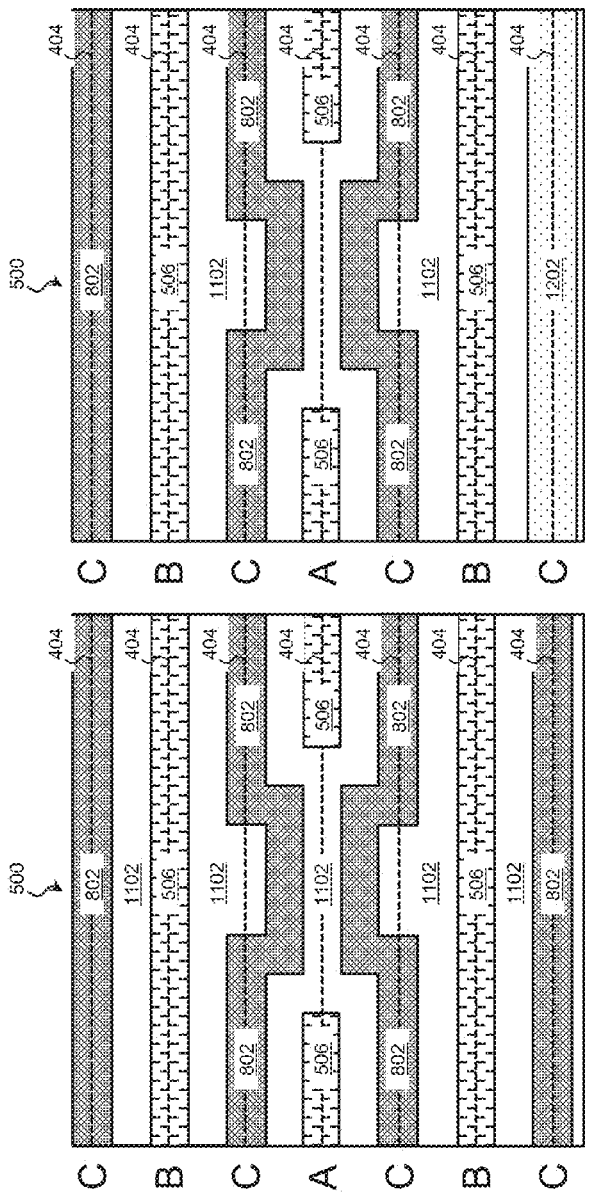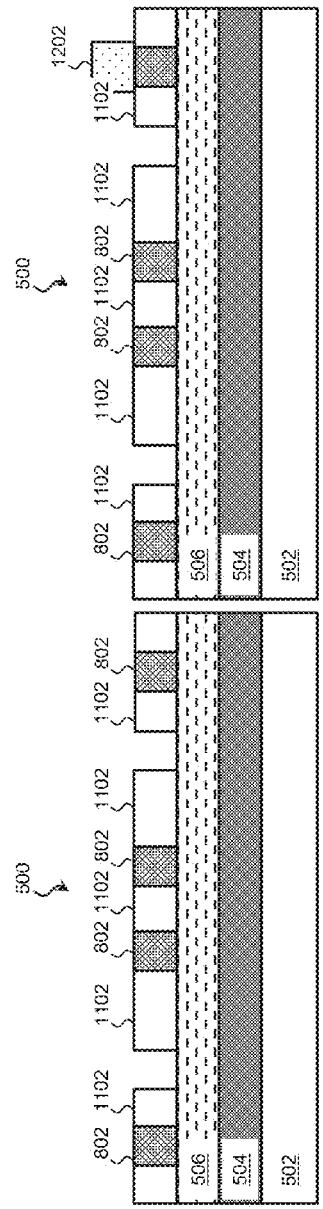

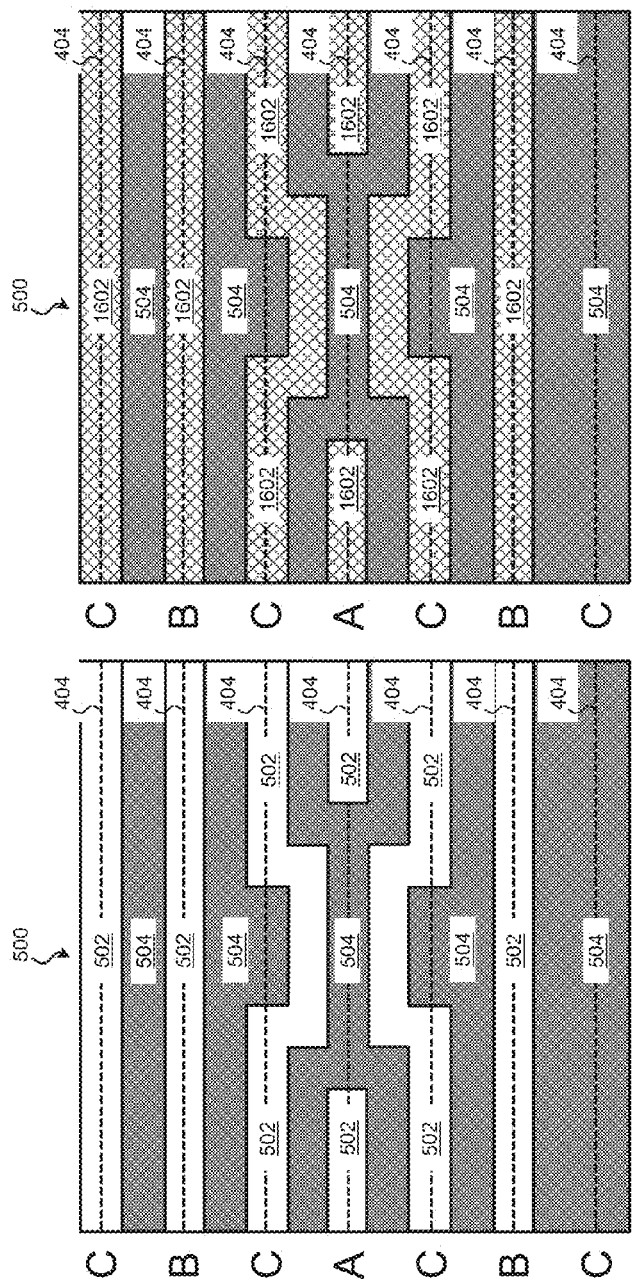
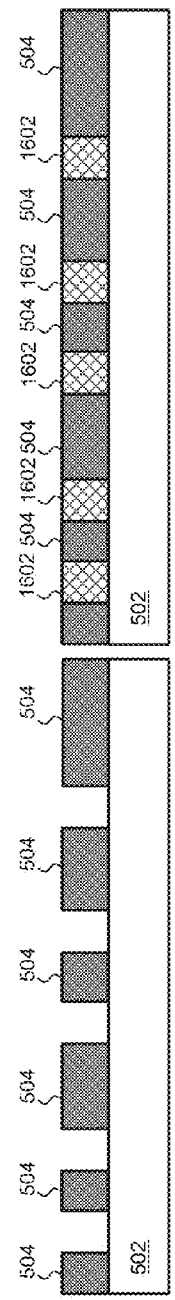

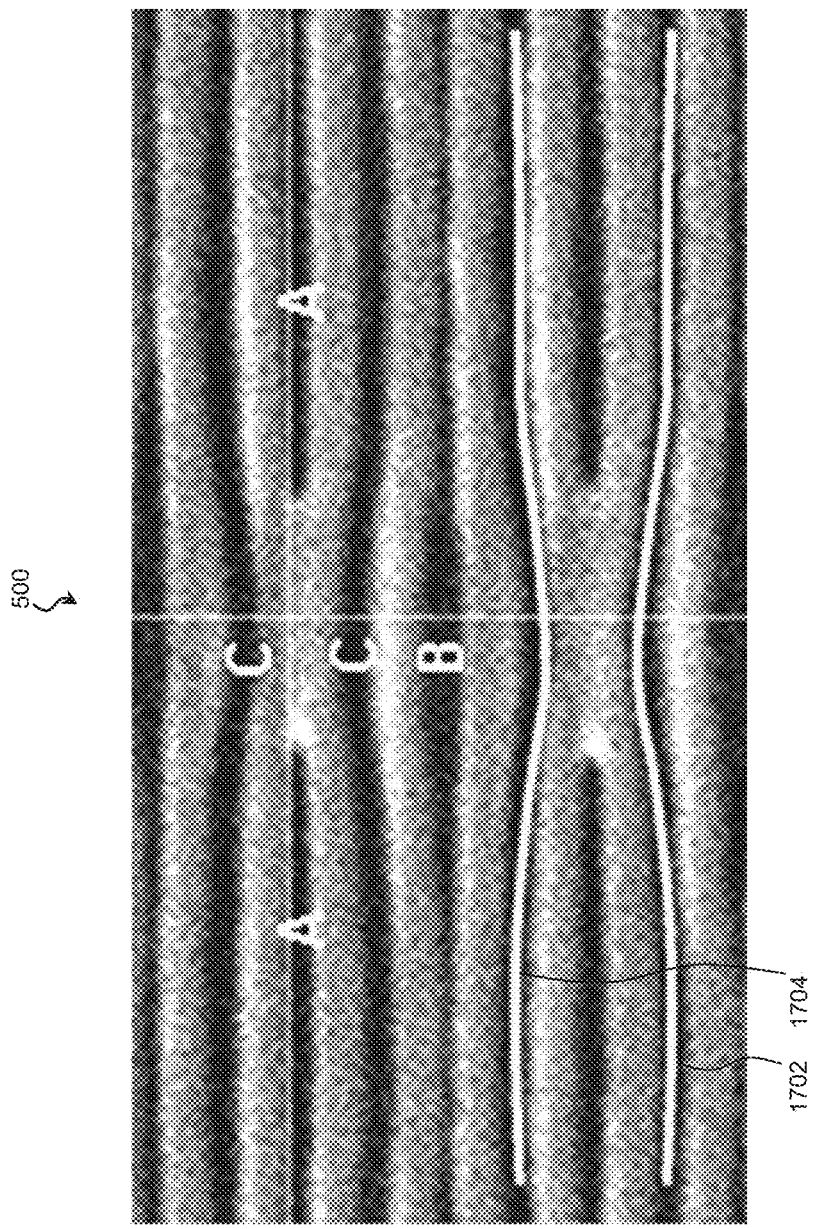

LITHOGRAPHIC TECHNIQUE FOR FEATURE CUT BY LINE-END SHRINK

CROSS-REFERENCE TO RELATED APPLICATIONS

This application claims priority to U.S. Provisional Patent Application Ser. No. 62/094,759, filed on Dec. 19, 2014, the entire disclosure of which is hereby incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

As merely one example, advances in lithography have been important to reducing device size. In general, lithography is the formation of a pattern on a target. In one type of lithography, referred to as photolithography, radiation such as ultraviolet light passes through or reflects off a mask before striking a photoresist coating on the target. Photolithography transfers a pattern from the mask onto the photoresist, which is then selectively removed to reveal the pattern. The target then undergoes processing steps that take advantage of the shape of the remaining photoresist to create features on the target. Another type of lithography, referred to as direct-write lithography, uses a laser, an electron beam (e-beam), ion beam, or other narrow-focused emission to expose a resist coating or to pattern a material layer directly. E-beam lithography is one of the most common types of direct-write lithography, and, by directing a collimated stream of electrons to the area to be exposed, can be used to remove, add, or otherwise change a material layer with remarkable accuracy.

In order to pursue even smaller critical dimensions (CD) of device features, multiple lithographic patterning iterations may be performed in order to define a single set of features. However, because of the complex interactions between the lithographic iterations, many such processes involve strict design rules specific to the lithographic techniques to be used. Design rules associated with a particular lithographic flow may not be acceptable for all designs. Therefore, while existing lithographic techniques have been generally adequate, they have not proved entirely satisfactory in all respects. Improved techniques for multiple patterning may relax existing design rules, overcome existing limitations, and thereby enable even more robust circuit devices to be manufactured.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1B-1H are perspective views of a portion of a workpiece undergoing the first lithographic method according to various aspects of the present disclosure.

FIG. 1I is a top view of another portion of the workpiece undergoing the first lithographic method according to various aspects of the present disclosure.

FIGS. 2B-2H are perspective views of a portion of a workpiece undergoing the second lithographic method according to various aspects of the present disclosure.

FIG. 4 is a representation of a design database specifying a pattern to be formed on a workpiece according to various aspects of the present disclosure.

FIGS. 5A, 6A, 7A, 8A, 9A, 10A, 11A, 12A, 13A, 14A, 15A, and 16A are top views of a portion of a workpiece undergoing a patterning method according to various aspects of the present disclosure.

FIGS. 5B, 6B, 7B, 8B, 9B, 10B, 11B, 12B, 13B, 14B, 15B and 16B are cross-sectional views of a portion of a workpiece undergoing a patterning method according to various aspects of the present disclosure.

FIG. 17 is a scanning-electron microscope (SEM) image of a workpiece having undergone the patterning method according to various aspects of the present disclosure.

DETAILED DESCRIPTION

Figure 1A:
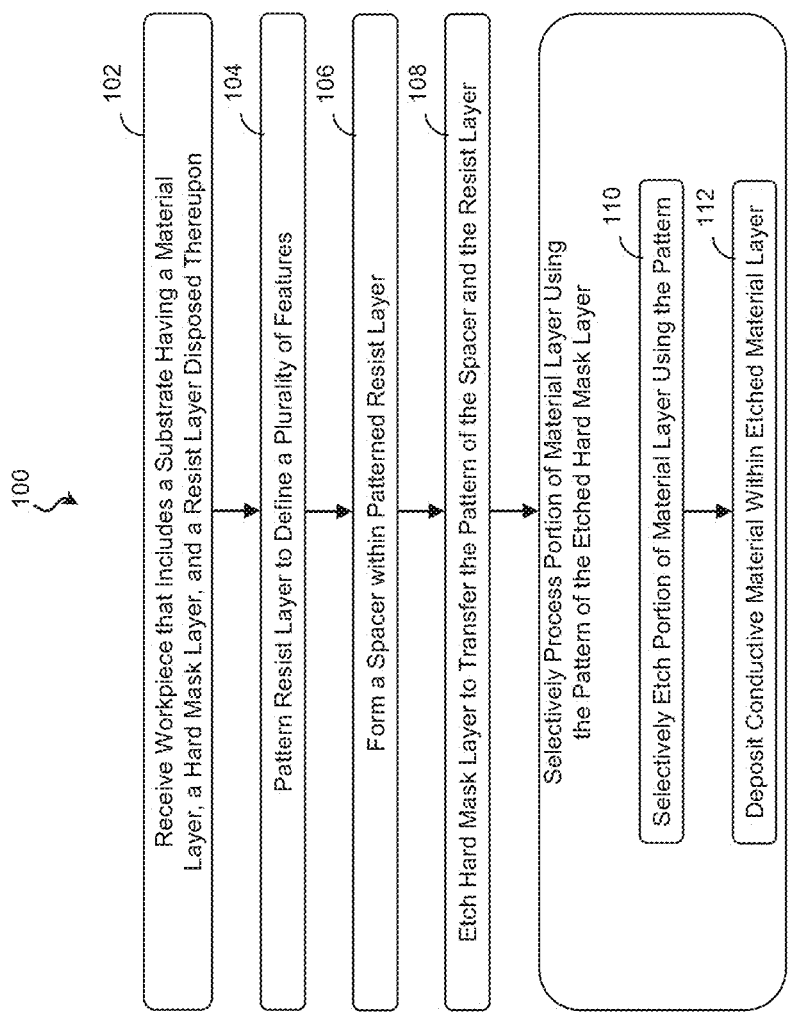
FIG. 1A is a flow diagram of a first lithographic method for patterning a workpiece according to various aspects of the present disclosure.

The present disclosure relates generally to IC device manufacturing and, more particularly, to a system and technique for lithographically patterning a workpiece to form a set of features.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure relates to the patterning of a workpiece, such as a semiconductor substrate, using lithography. The techniques of the present disclosure apply equally to wide range of lithographic techniques, including photolithography and direct-write lithography. Some examples of such a lithographic technique are described with reference to FIGS. 1A-I. FIG. 1A is a flow diagram of a first lithographic method 100 for patterning a workpiece according to various aspects of the present disclosure. It is understood that additional steps can be provided before, during, and after the method 100 and that some of the steps described can be replaced or eliminated for other embodiments of the method 100. FIGS. 1B-1H are perspective views of a portion of a workpiece 150 undergoing the first lithographic method according to various aspects of the present disclosure. FIG. 1I is a top view of another portion of the workpiece 150 undergoing the first lithographic method according to various aspects of the present disclosure. For clarity and ease of explanation, some elements of the figures have been simplified.

Figure 1B:
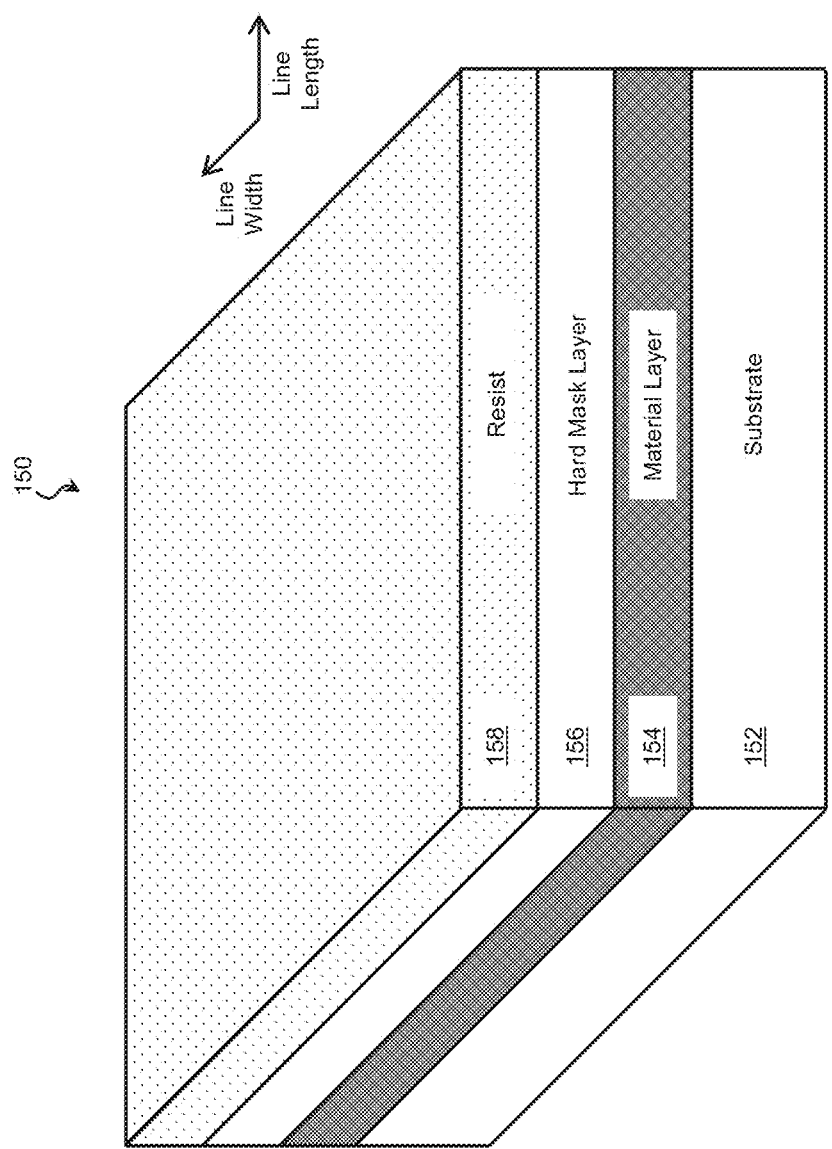

Referring to block 102 of FIG. 1A and to FIG. 1B, a workpiece 150 is received that includes a substrate 152 upon which other materials may be formed. One common type of substrate 152 used in integrated circuit (IC) fabrication is a bulk silicon substrate. Alternatively, the substrate 152 may comprise an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof. Possible substrates 152 also include a silicon-on-insulator (SOI) substrate. SOI substrates are fabricated using separation by implantation of oxygen (SIMOX), wafer bonding, and/or other suitable methods. In other examples, the substrate 152 may include a multilayer semiconductor structure.

The substrate 152 may include various doped regions (e.g., p-type wells or n-type wells), such as source/drain regions. The doped regions may be doped with p-type dopants, such as phosphorus or arsenic, and/or n-type dopants, such as boron or $BF_2$, depending on design requirements. The doped regions may be formed directly on the substrate, in a P-well structure, in an N-well structure, in a dual-well structure, or using a raised structure. Doped regions may be formed by implantation of dopant atoms, in-situ doped epitaxial growth, and/or other suitable techniques. In some embodiments, the doped regions include halo/pocket regions that can reduce short channel effects (e.g., punch-through effects) and may be formed by tilt-angle ion implantation or other suitable technique.

The substrate 152 may also include various material layers formed upon it. In the illustrated embodiment, the workpiece 150 includes a material layer 154 to be patterned and a hard mask layer 156 disposed on the material layer 154. Of course, one of skill in the art will recognize that the substrate 152 may have any number of material layers and/or hard mask layers. Suitable materials for the material layer(s) and hard mask layer(s) may be selected based on etchant selectivity, and in various exemplary embodiments, material layer 154 and hard mask layer 156 have different etchant selectivities such that each layer can be removed using a corresponding etchant without significant etching of the other layer. For example, various embodiments in which the patterning technique is used to pattern an inter-layer dielectric (ILD) in order to form an interconnect structure, material layer 154 includes a semiconductor and/or a dielectric material such as a semiconductor oxide, semiconductor nitride, and/or semiconductor oxynitride; and hard mask layer 156 includes a different material having a different etchant selectivity such as a different semiconductor, dielectric material, a metal nitride (e.g., TiN, TaN, etc.), a metal oxide, a metal oxynitride, and/or a metal carbide.

The substrate 152 may also include a lithographically-sensitive resist 158 such as a photoresist and/or e-beam resist tailored to the particular technique and energy source used in the subsequent patterning steps. An exemplary resist 158 includes a photosensitive material that causes the material to undergo a property change when exposed to radiation. This property change can be used to selectively remove exposed (in the case of a positive tone resist) or unexposed (in the case of a negative tone resist) portions of the resist layer 158.

Figure 1C:
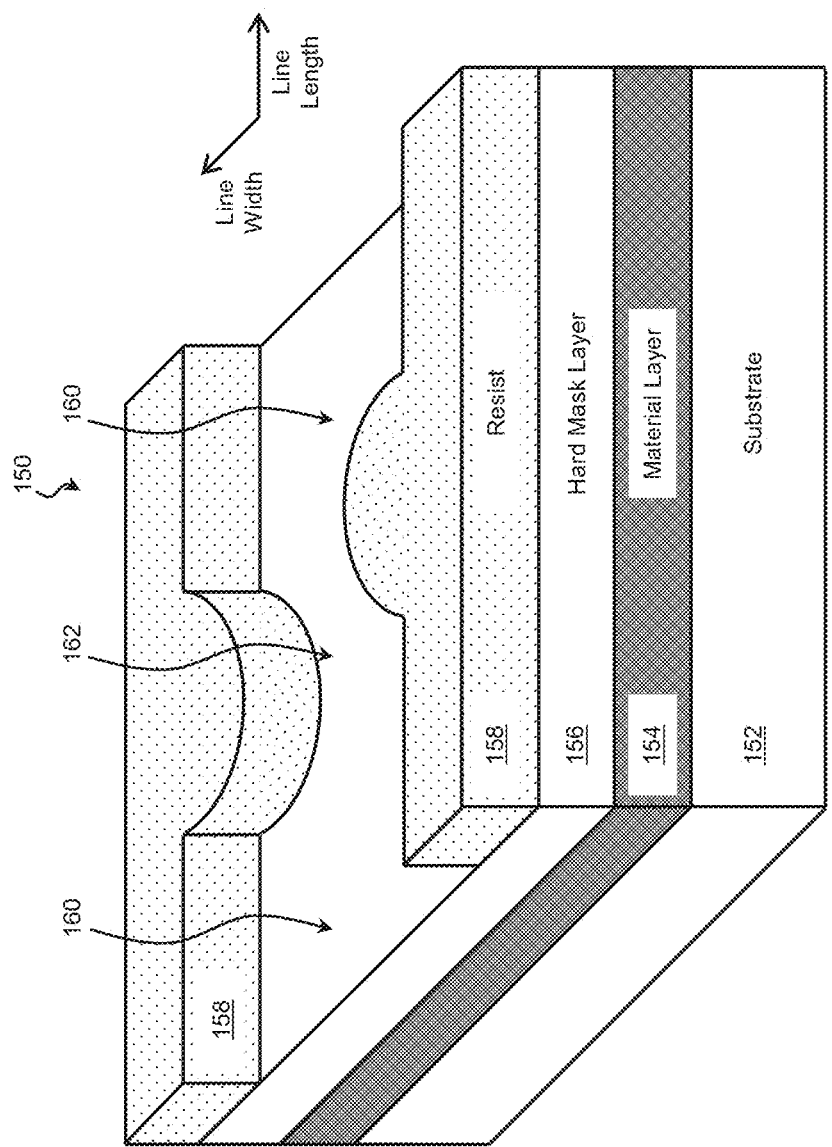

Referring to block 104 of FIG. 1A and to FIG. 1C, the resist layer 158 is patterned. Patterning may be performed using any suitable lithographic technique including photolithography and/or direct-write lithography. An exemplary photolithographic patterning process includes soft baking of a resist layer, mask aligning, exposure, post-exposure baking, developing the resist layer, rinsing, and drying (e.g., hard baking). An exemplary direct-write patterning process includes scanning the surface of a resist layer with an e-beam or other energy source while varying the intensity of the energy source in order to vary the dosage received by various regions of the resist layer.

In many conventional patterning techniques, multiple exposures are used to define a single set of features. For example, a first exposure may define large regions corresponding to one or more features, while a second exposure (often referred to as a line-cut) defines segments of the large regions to remove in order to separate the features. However, correctly aligning the exposures in a multiple exposure process is challenging and alignment errors may render a workpiece unusable. Accordingly, the embodiments of FIGS. 1A-1I provide a technique for separating features using a line-end shrink process that can separate features without a separate line-cut exposure.

In the example of FIG. 1C, a single recess in the resist layer 158 is used to define two independent, separate, and unconnected features. Feature regions are indicated generally by marker 160. The feature regions 160 within the trench are joined by a line-end linking feature 162. A line-end linking feature 162 may be added between any two features and may be used when the features are spaced less than some minimum threshold apart. In the illustrated embodiment, the line-end linking feature 162 has a narrower width than the feature regions 160. The width is selected so that a spacer material deposited within the line-end linking feature 162 will span the line-end linking feature 162 and physically separate the feature regions 160.

Figure 1D:
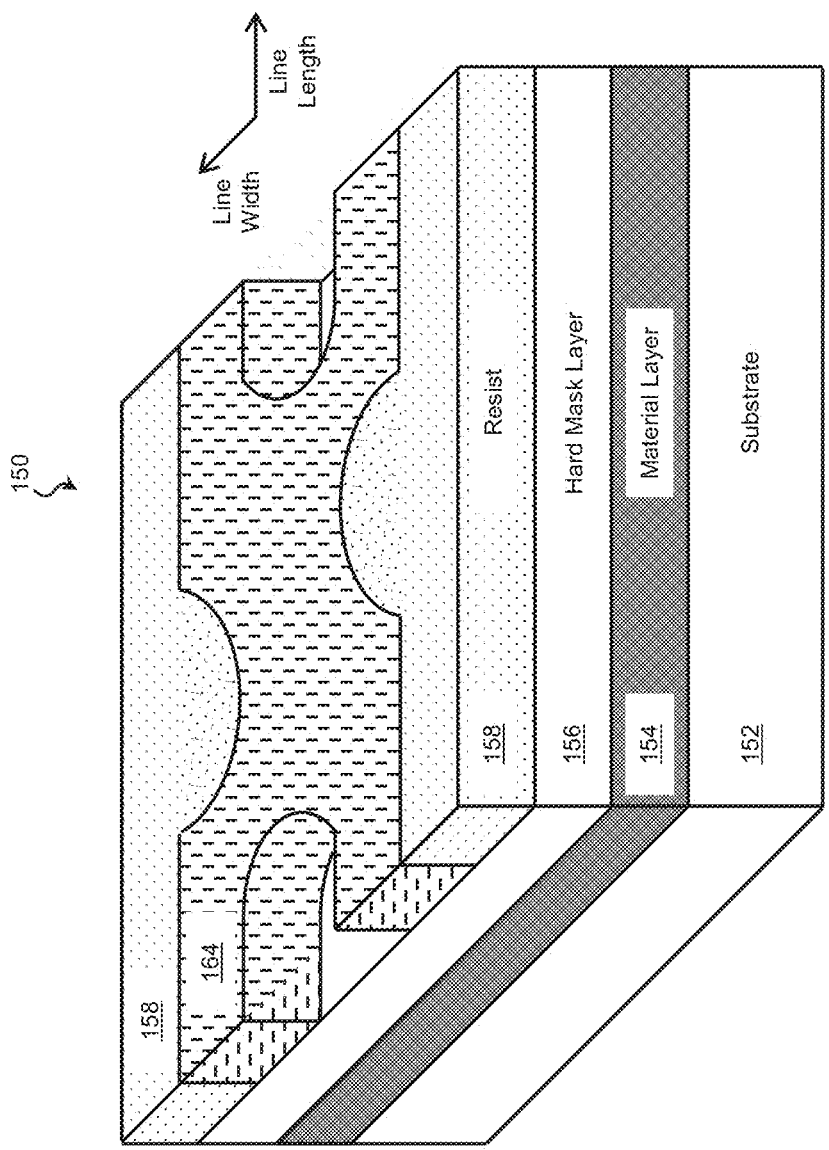

Referring to block 106 of FIG. 1A and to FIG. 1D, a spacer 164 is formed on the sidewalls of the remaining resist 158. The spacer 164 may include any suitable material (e.g., metal oxide, metal nitride, metal oxynitride, metal carbide, semiconductor, dielectric, etc.) and may be selected to have a different etchant selectivity than the hard mask layer 156. The material of the spacer 164 may be deposited by any suitable process including atomic layer deposition (ALD), chemical vapor deposition (CVD), plasma-enhanced CVD (PE CVD), and/or other suitable deposition techniques. In one such embodiment, the material of the spacer 164 is deposited conformally by ALD and an anisotropic (directional) etching technique such, as an anisotropic plasma etching, is performed to remove portions of the spacer 164 deposited on horizontal surfaces of the resist layer 158 and the hard mask layer 156. In this way, only those portions of the spacer 164 deposited on the vertical surfaces of the resist layer 158 remain.

In other embodiments, the material of the spacer 164 is deposited using a wet chemical reactant selected to react with the resist layer 158 to produce a precipitate that forms the spacer 164. The workpiece 150 may be rinsed to remove unreacted reactant and an anisotropic etching may be performed to remove portions of the spacer 164 deposited on horizontal surfaces of the resist layer 158 and the hard mask layer 156.

The use of this line-end shrinking technique may provide numerous advantages. For example, as mentioned above, by using line-end shrinking and the associated line-end linking features 160, a line-cut process may be eliminated. In turn, this may avoid complications and defects associated with an additional lithographic patterning step. In some applications, eliminating a line-cut process reduces the number of hard mask layers used to pattern the material layer 154. As another example, because the spacer 164 is formed on the sidewalls of the hard mask layer 156, the trench in the hard mask layer 156 formed in block 104 is wider in the line width direction than the feature to be formed. Because many lithographic processes operate at the very limits of the minimum resolvable line width, forming a wider trench in the hard mask layer 156 may allow some lithographic rules to be relaxed and may allow the formation of smaller features than would otherwise be possible. Of course, these advantages are merely exemplary, and no advantage is required for any particular embodiment.

Figure 1E:
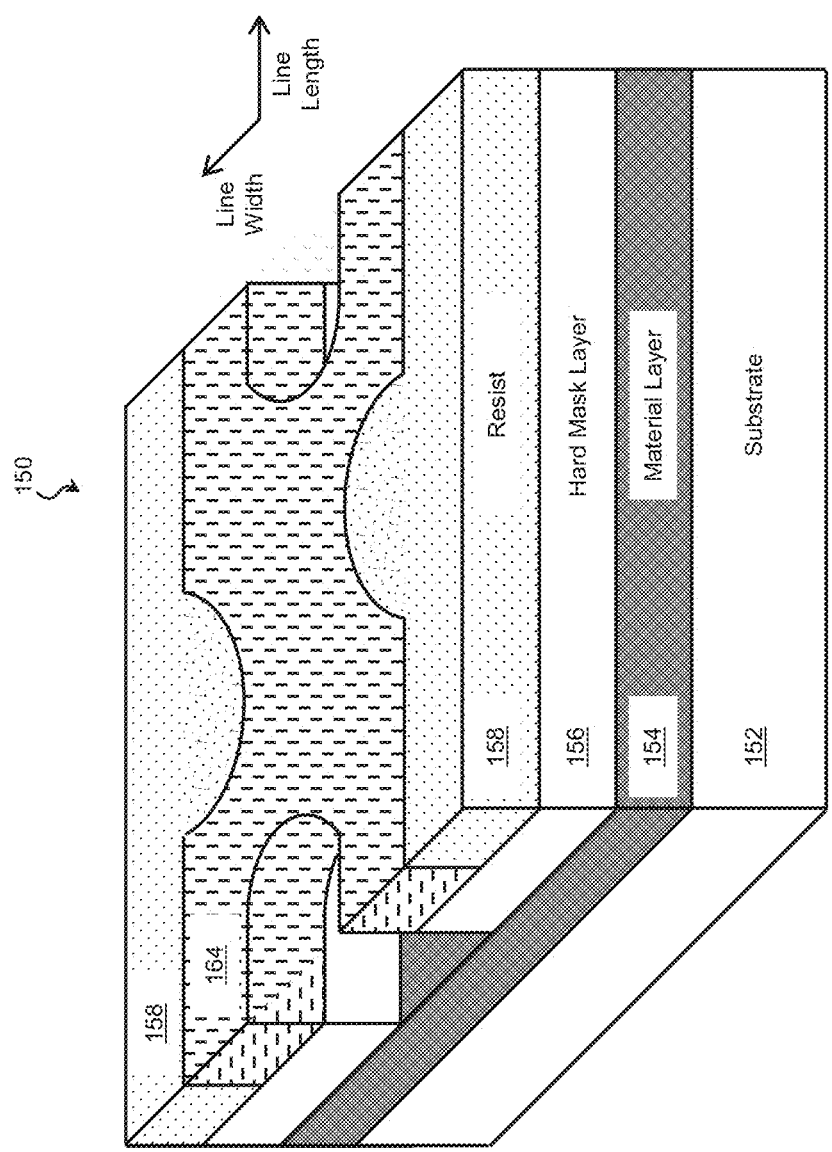
Figure 1G:
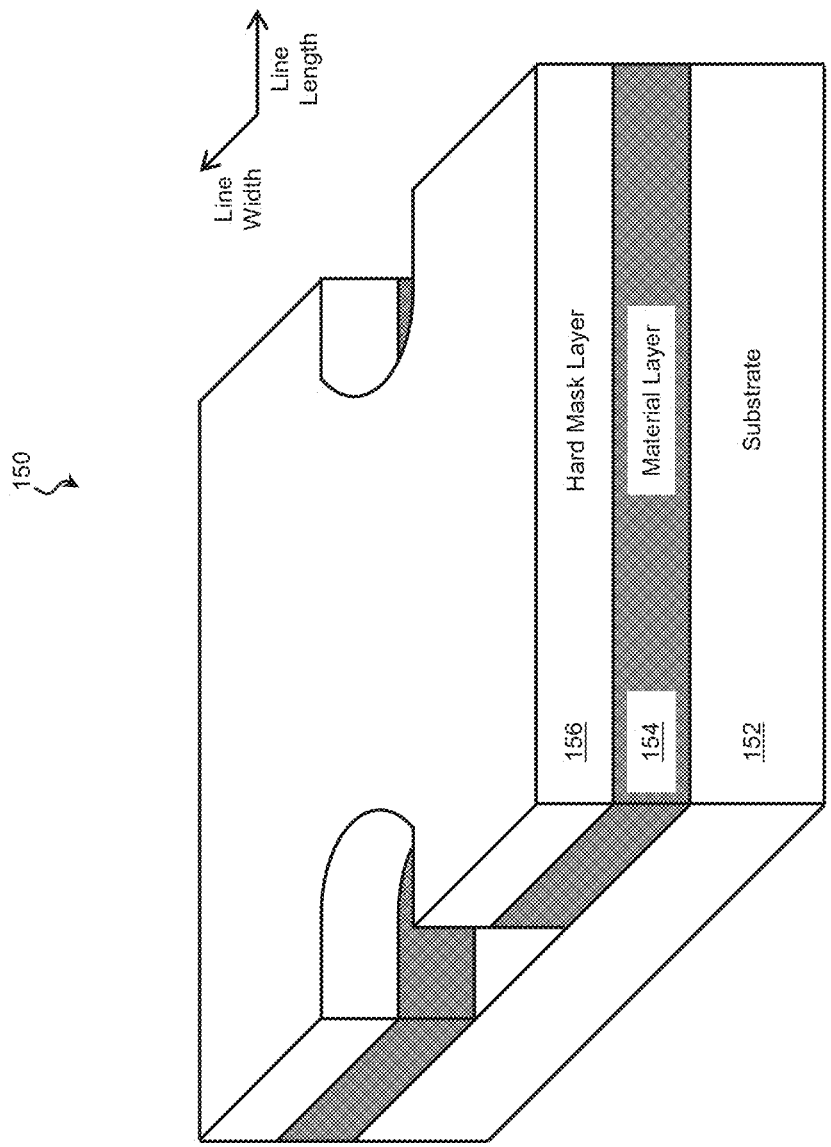
Figure 11:
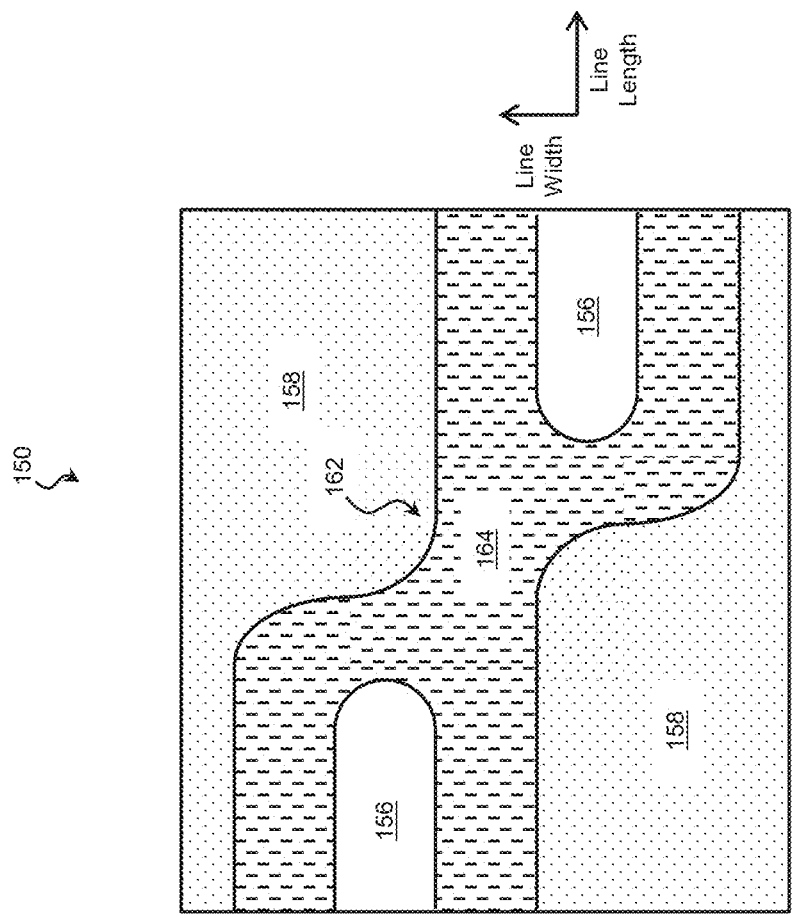

Referring to block 108 of FIG. 1A and to FIG. 1E, an exposed portion of the hard mask layer 156 is etched to transfer the pattern of the resist layer 158 and the spacer 164 to the hard mask layer 156. The etching may include any suitable etching technique including wet etching, dry etching, reactive ion etching, ashing, and/or other suitable technique, and the etching technique and etchant chemistry may be selected to produce substantially isotropic etching of the exposed hard mask layer 156 without substantial etching of the resist layer 158 and/or spacer 164. Referring to FIG. 1F, the resist layer 158 and/or the spacer 164 may be removed after etching the hard mask layer 156.

The etched hard mask layer 156 can be used to selectively process any underlying portion of the substrate 152 and/or material layers (e.g., layer 154). In that regard, the hard mask layer 156 may be used in conjunction with any etching process, deposition process, implantation process, epitaxy process, and/or any other fabrication process. In some examples, the material layer 154 is patterned using the hard mask layer 156 in order to form an interconnect structure. In one such example, referring to block 110 of FIG. 1A and to FIG. 1G, the exposed portions of the material layer 154 are patterned using any suitable etching technique including dry etching, wet etching, reactive ion etching, ashing, and/or other suitable etching technique. After the etching, any remaining portion of the hard mask layer 156 may be removed.

Referring to block 112 of FIG. 1A and to FIG. 1H, one or more layers of a conductive material 166 are deposited on the patterned material layer 154 including within the etched portion. Suitable conductive materials 166 include metals, metal oxides, metal nitrides, metal oxynitrides, metal carbides, and/or nonmetallic conductors, and in one such embodiment, the conductive material 166 includes a TiN barrier layer disposed on the material layer 154 and a copper-containing fill material disposed on the barrier layer. Any portion of the conductive material 166 extending above the material layer 154 may be removed using a chemical-mechanical polishing/planarization (CMP) process or other suitable technique.

The technique may also be applied to features of the workpiece 150 that are offset in the line width direction. Accordingly, FIG. 1I illustrates another region of the workpiece 150 in which a line-end linking feature 162 is used to perform a line-end shrink to separate offset features. FIG. 1I shows the workpiece 150 following the formation of the spacer described in block 106 of FIG. 1A. The method 100 proceeds identically, and in many embodiments, the workpiece 150 includes features that are aligned in the line width direction as shown in FIGS. 1B-1H as well as offset as shown in FIG. 1I.

Figure 2A:
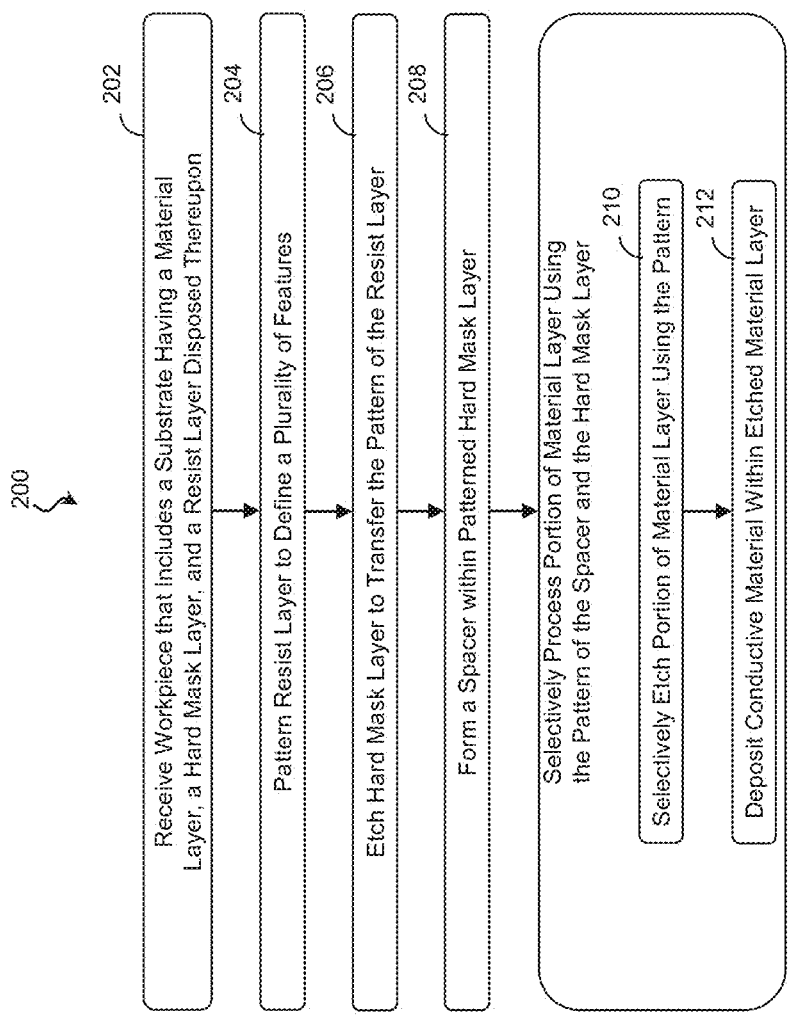
FIG. 2A is a flow diagram of a second lithographic method for patterning a workpiece according to various aspects of the present disclosure.

Whereas the example of method 100 forms the spacer 164 on the vertical sidewalls of the resist layer 158 and uses the combined spacer 164 and resist layer 158 to pattern the hard mask layer 156, in further embodiments, the resist layer 158 is used to pattern the hard mask layer 156 and the spacer 164 is subsequently formed on the hard mask layer 156. Some embodiments utilizing the later technique are described with reference to FIGS. 2A-I. FIG. 2A is a flow diagram of a second lithographic method 200 for patterning a workpiece according to various aspects of the present disclosure. It is understood that additional steps can be provided before, during, and after the method 200 and that some of the steps described can be replaced or eliminated for other embodiments of the method 200. FIGS. 2B-2H are perspective views of a portion of a workpiece 150 undergoing the second lithographic method according to various aspects of the present disclosure. FIG. 2I is a top view of another portion of the workpiece 150 undergoing the second lithographic method according to various aspects of the present disclosure. For clarity and ease of explanation, some elements of the figures have been simplified.

Figure 2B:
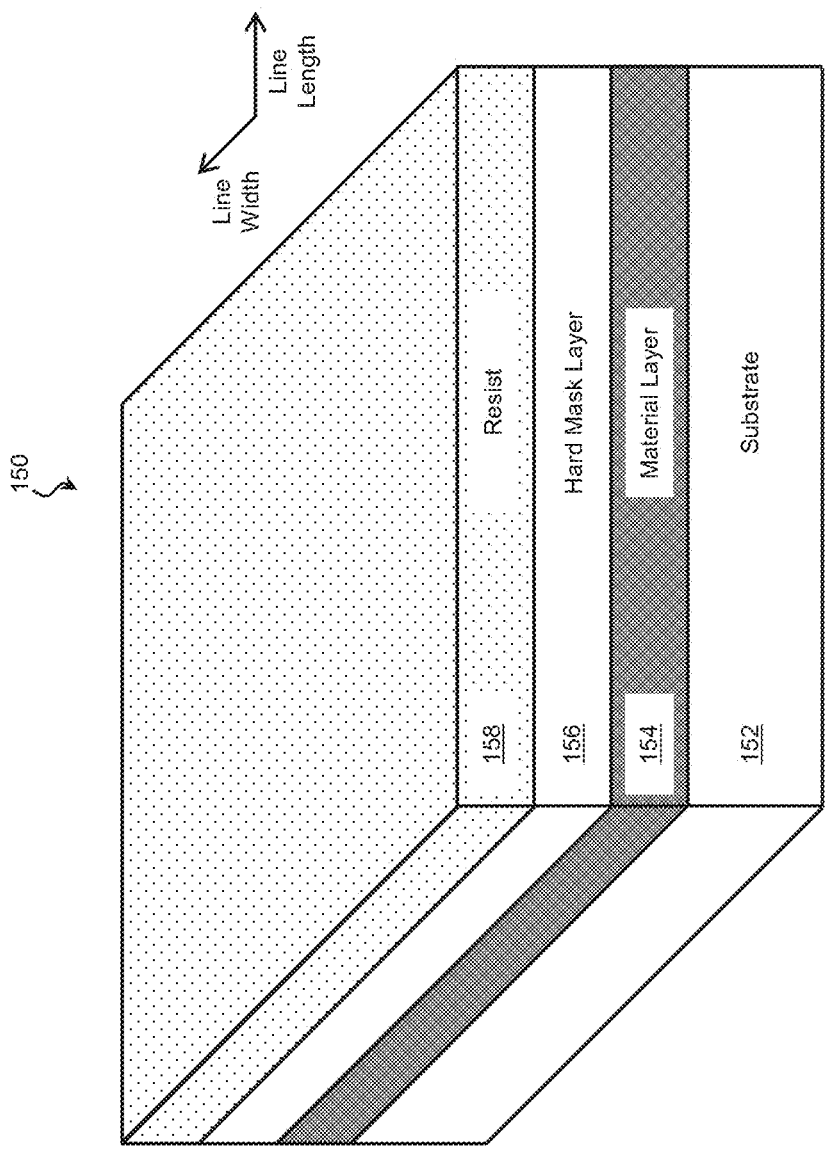
Figure 2C:
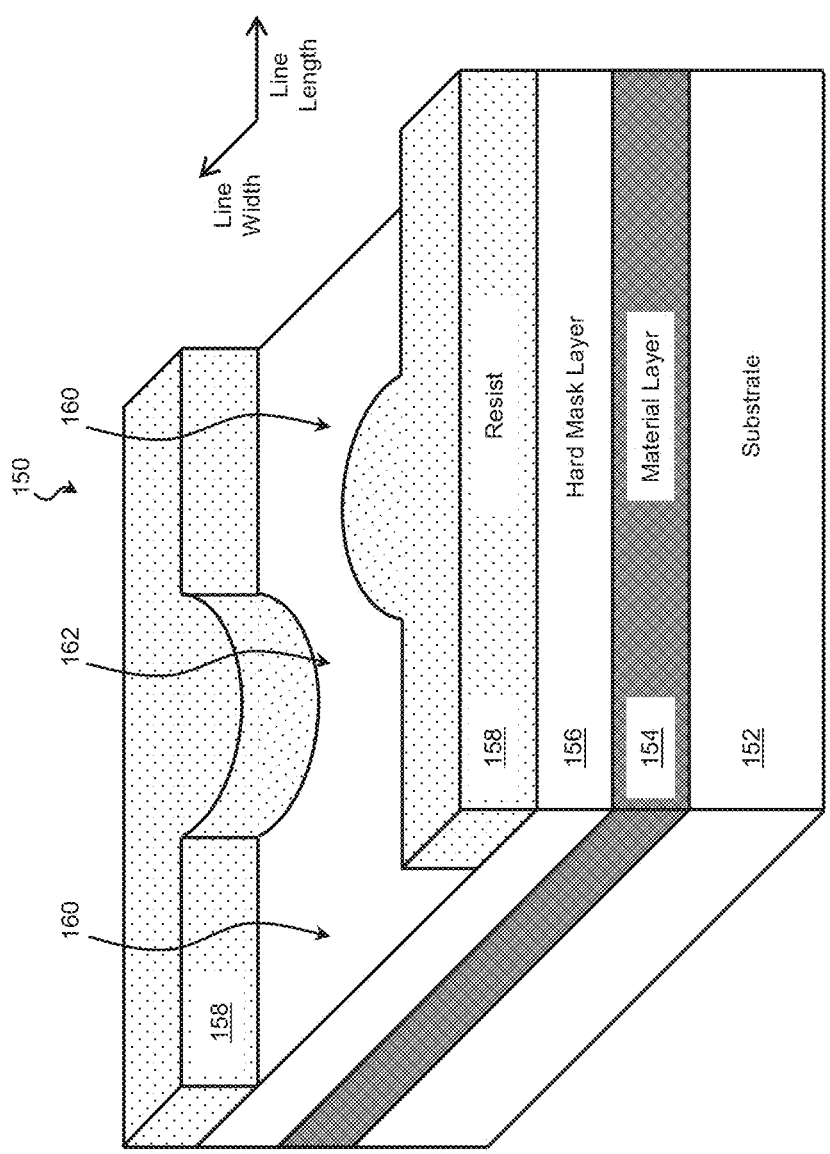

Referring to block 202 of FIG. 2A and to FIG. 2B, a workpiece 150 is received that includes a substrate 152 upon which other materials may be formed. In some embodiments, the substrate 152 includes a material layer 154, a hard mask layer 156, and a resist layer 158, each substantially similar to those of FIGS. 1A-I. Referring to block 204 of FIG. 2A and to FIG. 2C, the resist layer 158 is patterned. The patterning may be performed substantially as described with respect to block 104 of FIG. 1A and may utilize any suitable lithographic technique including photolithography and/or direct-write lithography. In the example of FIG. 2C, a single recess in the resist layer 158 is used to define two independent, separate, and unconnected features. Feature regions are indicated generally by marker 160. The feature regions 160 within the trench are joined by a line-end linking feature 162. A line-end linking feature 162 may be added between any two features and may be used when the features are spaced less than some minimum threshold apart. In the illustrated embodiment, the line-end linking feature 162 has a narrower width than the feature regions 160. The width is selected so that a spacer material deposited within the line-end linking feature 162 will span the line-end linking feature 162 and physically separate the feature regions 160.

Figure 2D:
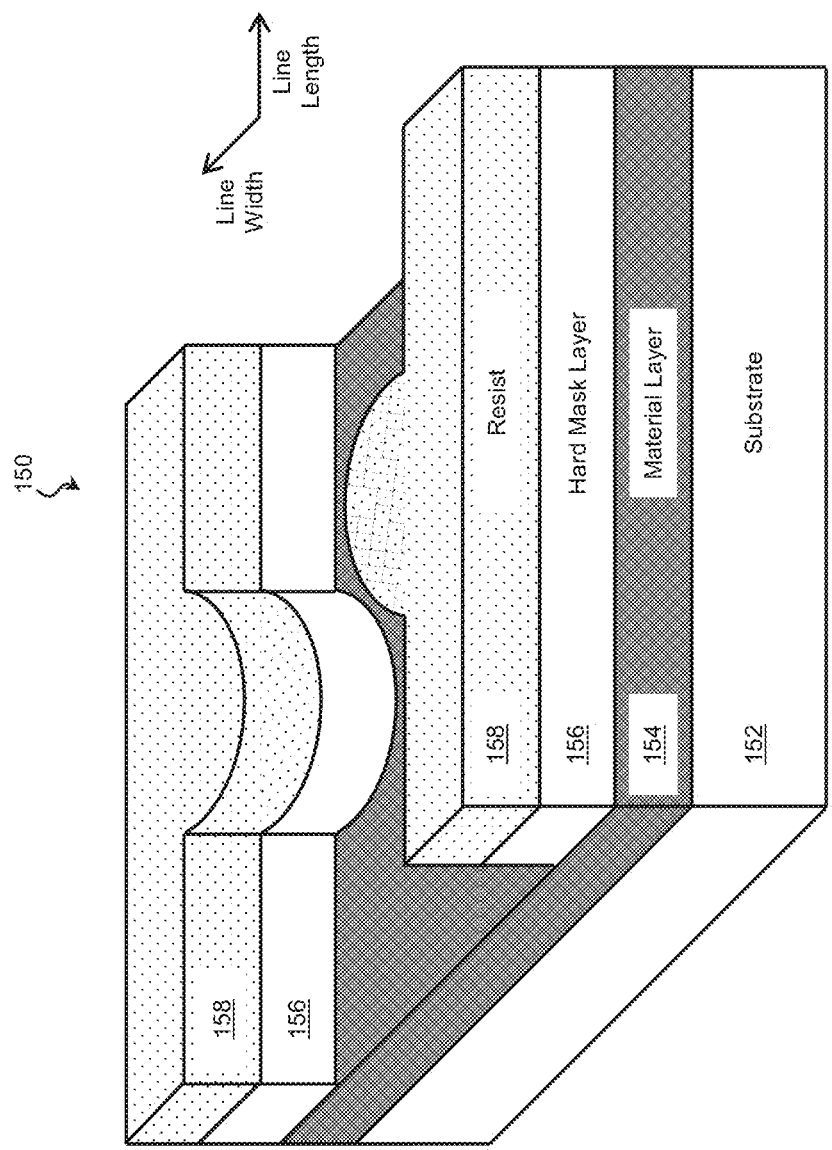

Referring to block 206 of FIG. 2A and to FIG. 2D, the patterned resist 158 is used to selectively remove a portion of the hard mask layer 156. This transfers the pattern of the resist 158 to the hard mask layer 156. The etching may include any suitable etching technique including wet etching, dry etching, reactive ion etching, ashing, and/or other suitable technique, and the etching technique and etchant chemistry may be selected to produce substantially isotropic etching of the exposed hard mask layer 156 without substantial etching of the resist layer 158. Referring to FIG. 2E, the remaining resist layer 158 may be removed after etching the hard mask layer 156.

Figure 2F:
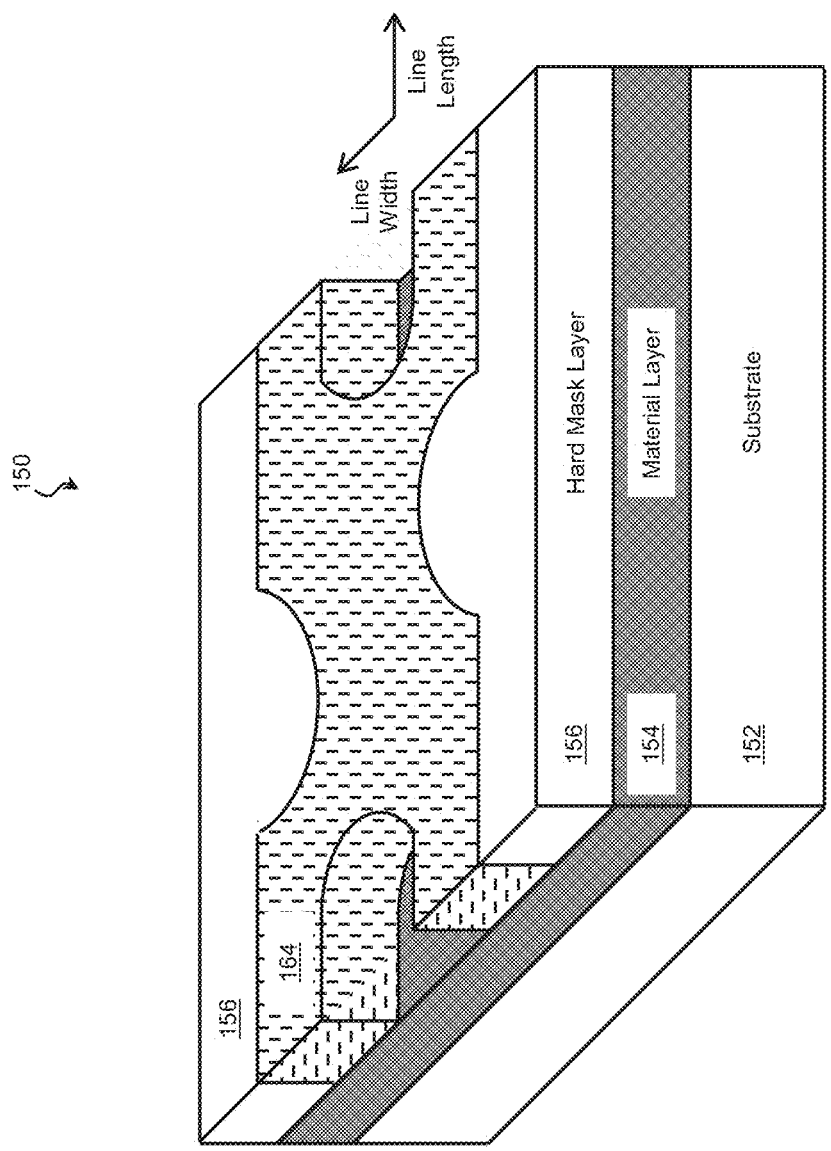
Figure 2G:
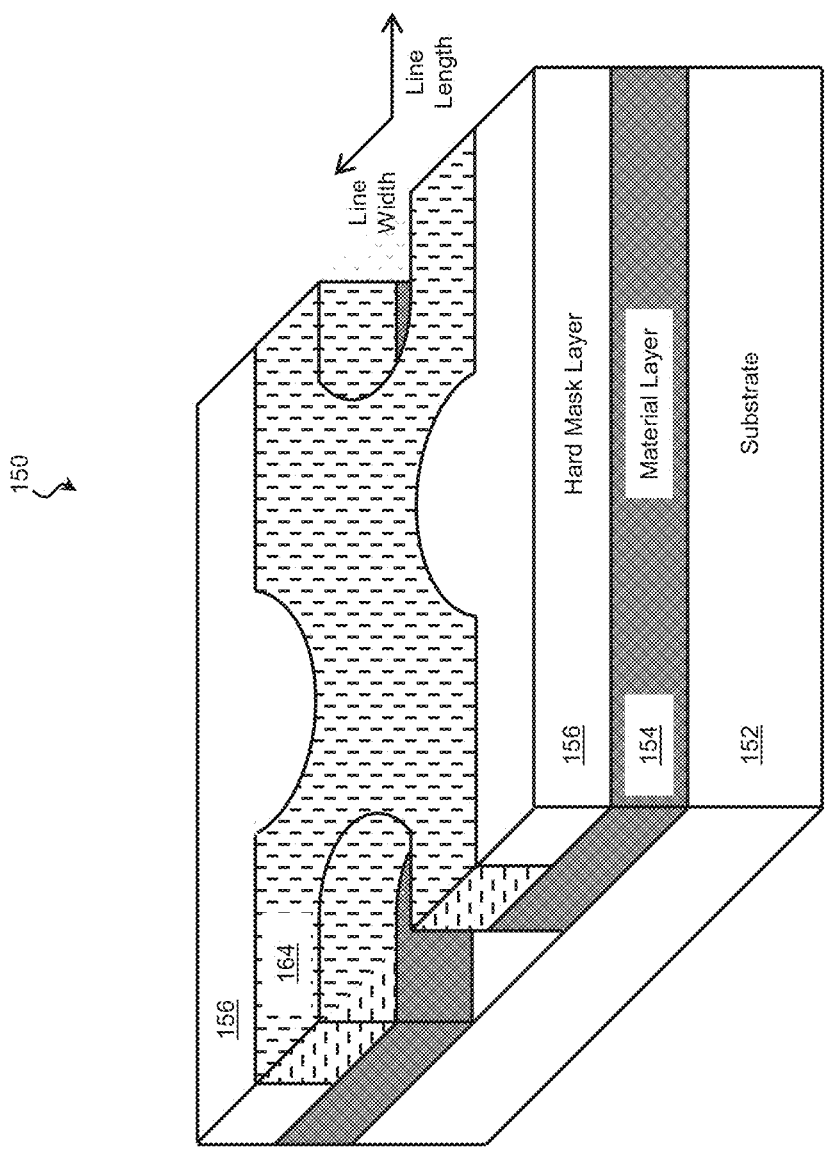

Referring to block 208 of FIG. 2A and to FIG. 2F, a spacer 164 is formed on the sidewalls of the remaining hard mask layer 156. The spacer 164 may be substantially similar to that of FIGS. 1A-1I and may include any suitable material (e.g., metal oxide, metal nitride, metal oxynitride, metal carbide, semiconductor, dielectric, etc.). The material of the spacer 164 may be selected to have a different etchant selectivity than the material layer 154. The material of the spacer 164 may be deposited by any suitable process including atomic layer deposition (ALD), chemical vapor deposition (CVD), plasma-enhanced CVD (PE CVD), and/or other suitable deposition techniques. In one such embodiment, the material of the spacer 164 is deposited conformally by ALD and an anisotropic (directional) etching technique such, as an anisotropic plasma etching, is performed to remove portions of the spacer 164 deposited on horizontal surfaces of the hard mask layer 156 and the material layer 154. In this way, only those portions of the spacer 164 deposited on the vertical surfaces of the hard mask layer 156 remain.

In other embodiments, the material of the spacer 164 is deposited using a wet chemical reactant selected to react with the hard mask layer 156 to produce a precipitate that forms the spacer 164. The workpiece 150 may be rinsed to remove unreacted reactant and an anisotropic etching may be performed to remove portions of the spacer 164 deposited on horizontal surfaces of the hard mask layer 156 and the material layer 154.

The spacer 164 and the hard mask layer 156 can be used to selectively process any underlying portion of the substrate 152 and/or material layers (e.g., layer 154). In that regard, the spacer 164 and the hard mask layer 156 may be used in conjunction with any etching process, deposition process, implantation process, epitaxy process, and/or any other fabrication process. In some examples, the material layer 154 is patterned using the spacer 164 and the hard mask layer 156 in order to form an interconnect structure. In one such example, referring to block 210 of FIG. 2A and to FIG. 2G, the exposed portions of the material layer 154 are patterned using any suitable etching technique including dry etching, wet etching, reactive ion etching, ashing, and/or other suitable etching technique. After the etching, any remaining portion of the spacer 164 and/or hard mask layer 156 may be removed.

Figure 2H:
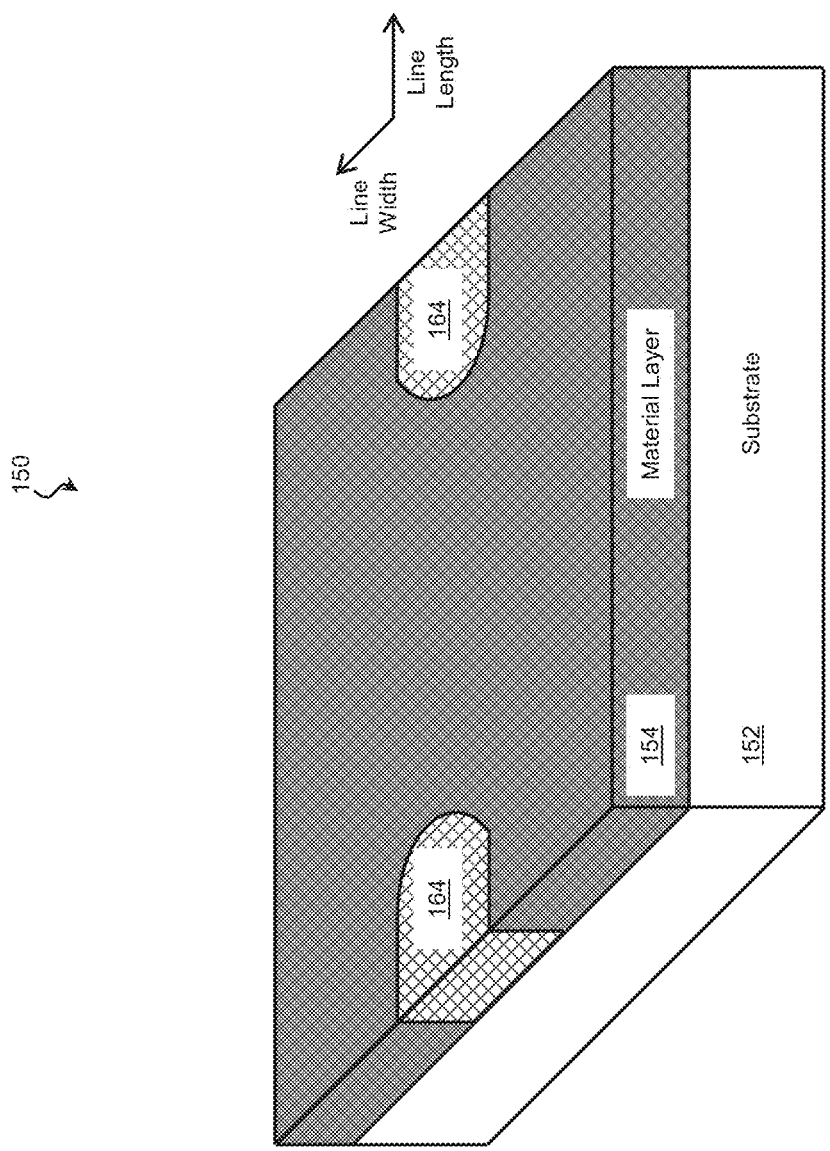
Figure 2I:
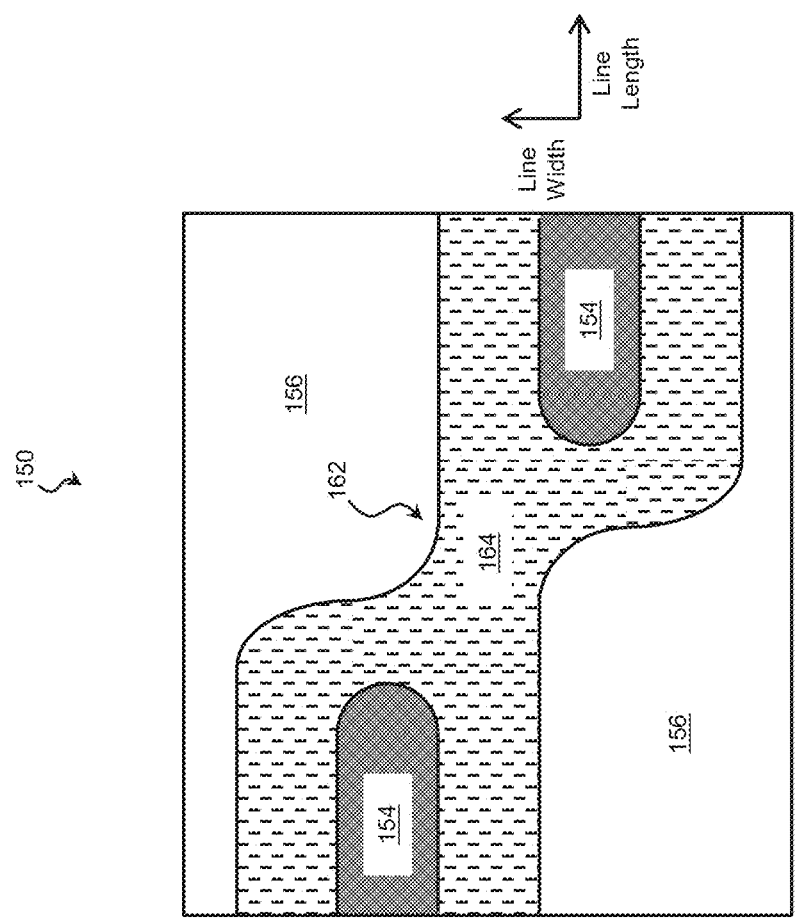
FIG. 2I is a top view of another portion of the workpiece undergoing the second lithographic method according to various aspects of the present disclosure.

Referring to block 212 of FIG. 2A and to FIG. 2H, one or more layers of a conductive material 164 are deposited on the patterned material layer 154 including within the etched portion. Suitable conductive materials 164 include metals, metal oxides, metal nitrides, metal oxynitrides, metal carbides, and/or nonmetallic conductors, and in one such embodiment, the conductive material 164 includes a TiN barrier layer disposed on the material layer 154 and a copper-containing fill material disposed on the barrier layer. Any portion of the conductive material 164 extending above the material layer 154 may be removed using a chemical-mechanical polishing/planarization (CMP) process or other suitable technique.

The technique may also be applied to features of the workpiece 150 that are offset in the line width direction. Accordingly, FIG. 2I illustrates another region of the workpiece 150 in which a line-end linking feature 162 is used to perform a line-end shrink to separate offset features. FIG. 2I shows the workpiece 150 following the formation of the spacer described in block 208 of FIG. 2A. The method 200 proceeds identically, and in many embodiments, the workpiece 150 includes features that are aligned in the line width direction as shown in FIGS. 2B-2H as well as offset as shown in FIG. 2I.

Figure 3:
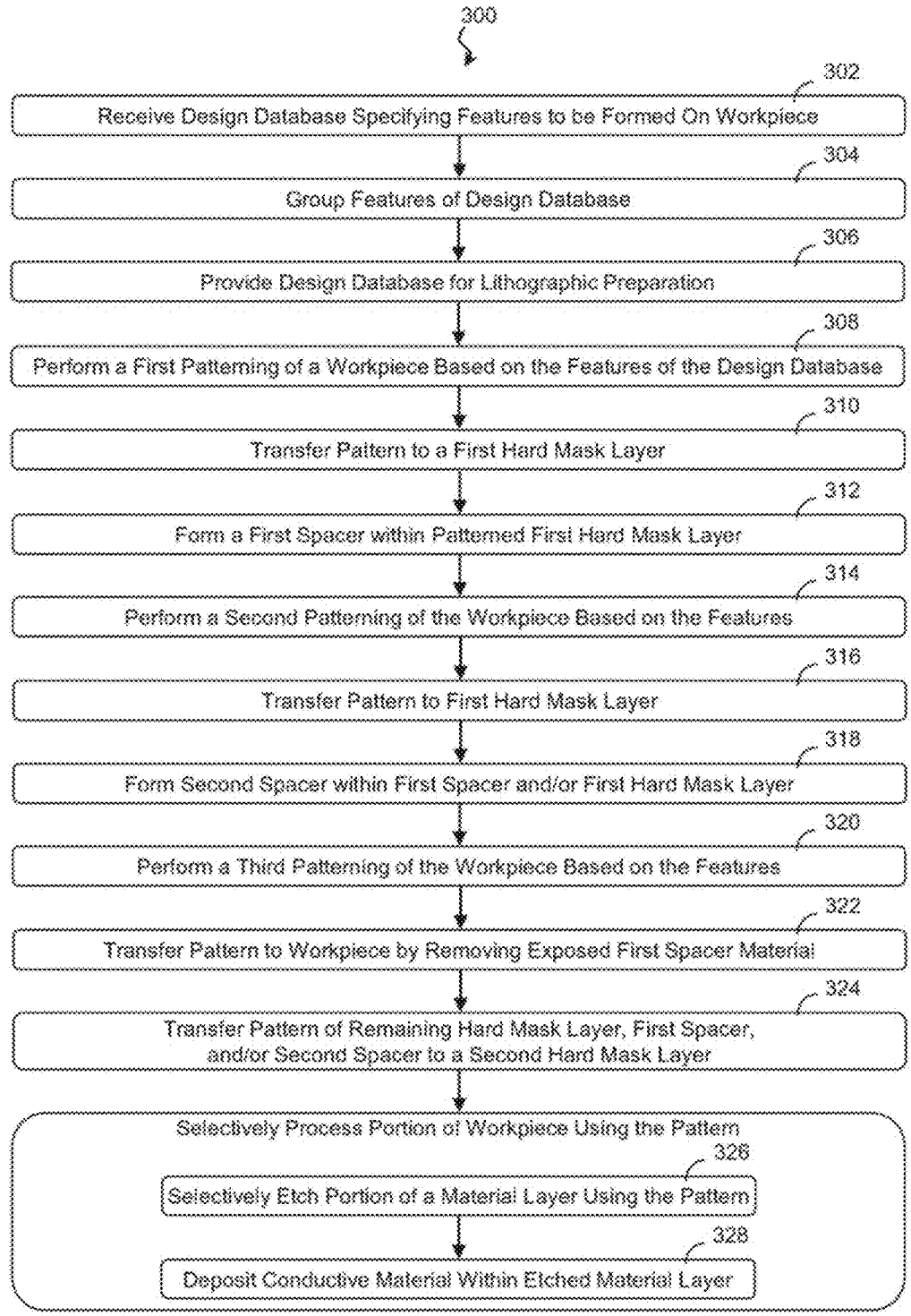
FIG. 3 is a flow diagram of a method for patterning a workpiece according to various aspects of the present disclosure.

Further embodiments of the lithographic patterning technique will now be described with reference to FIGS. 3-17. FIG. 3 is a flow diagram of a method 300 for patterning a workpiece 500 according to various aspects of the present disclosure. It is understood that additional steps can be provided before, during, and after the method 300 and that some of the steps described can be replaced or eliminated for other embodiments of the method 300. FIG. 4 is a representation of a design database 400 specifying a pattern to be formed on the workpiece according to various aspects of the present disclosure. FIGS. 5A, 6A, 7A, 8A, 9A, 10A, 11A, 12A, 13A, 14A, 15A, and 16A are top views of a portion of the workpiece 500 undergoing the patterning method according to various aspects of the present disclosure. FIGS. 5B, 6B, 7B, 8B, 9B, 10B, 11B, 12B, 13B, 14B, 15B, and 16B are corresponding cross-sectional views of a portion of the workpiece undergoing the patterning method according to various aspects of the present disclosure. The cross-sectional plane is shown in FIG. 5A by reference line 501. FIG. 17 is a scanning-electron microscope (SEM) image 1700 of a workpiece 500 having undergone the patterning method according to various aspects of the present disclosure. For clarity and ease of explanation, some elements of the figures have been simplified.

Referring to block 302 of FIG. 3 and to FIG. 4, a design database 400 is received at a computing system. The design database 400 includes any number of features 402 to be formed on the workpiece and represents these features in the form of a data file stored on a non-transitory computer-readable medium. Various design standards exist for representing the features 402 including GDSII, OASIS, CIF (Caltech Intermediate Form), and MEBES®, a registered trademark of Applied Materials, and in various embodiments, the design database 400 represents the features 402 in these and/or other suitable formats. In the illustrated embodiment, the features 402 are aligned in tracks 404. Tracks are typically used to align features 402 according to a minimum spacing although there is no requirement that a feature 402 be aligned with a track 404.

Referring to block 304 of FIG. 3 and to FIG. 4, the features 402 are grouped based in part on the tracks 404 to which they are aligned. In the illustrated embodiment of FIG. 4, the tracks 404 correspond to three groups, labeled A, B, and C, according to a repeating pattern. In this example, features 402 in group A have a first pitch (e.g., a center-to-center spacing interval) with respect to the other features 402 in the group, and features 402 in group B have a similar pitch with respect to the other features 402 in the group. However, in this example, features in group C have a smaller pitch, in part because group C is associated with every other track 404. To support this smaller pitch, design rules may be implemented to ensure the fidelity of features 402 in group C. For example, a design rule may require minimum-spaced group C features to be separated by either a group B feature or a group A feature. In another example, a design rule may prohibit line ends of group B features or group A features to occur between minimum-spaced group C features. These design rules and others may place undesirable constraints on the design database 400. Accordingly, the technique of method 300 provides a multiple patterning technique free from some or all of these design rules. This gives designers greater leeway, which may be leveraged to simplify routing and to form more features 402 in a smaller area.

Referring to block 306 of FIG. 3, the design database 400 including the grouped features is provided for lithographic preparation. In one such example, a mask house or other entity performs optical proximity correction (OPC) on the design database 400 by adding sub-resolution assist features, serifs, hammerheads, and/or other enhancements to the database features 402. Other types of optical compensation are described in more detail below. Some lithographic preparation steps performed in block 306 are specific to the type of lithographic technique to be performed. For example, for a direct-write lithographic technique, preparation may include generating a set of emitter intensity values and/or other beam controls for an emitter (e.g., a laser, an e-beam emitter, an ion beam emitter, etc.) based on the features 402 of the design database 400.

For a photolithographic technique, preparation may include generating one or more masks (e.g., reflective and/or transmissive masks) based on the design database 400. In one such example, a mask house uses the design database 400 to manufacture a mask or mask set. In some such embodiments, an e-beam or e-beam array is used to pattern a mask by exposing portions of a beam resist formed on the mask. The patterned resist is then used to remove regions of an optical layer such as an absorptive layer of the mask. Additionally or in the alternative, the e-beam removes the optical layer directly by ablation or adds to the optical layer by performing a pinpoint deposition. Direct ablation and deposition are often used to correct mask defects. In that regard, after a mask has been fabricated, the mask house performs a mask inspection to determine if the fabricated mask includes any defects. Depending on the number and type of defects present, the mask may be repaired or recycled.

Referring to blocks 308-324, the result of this preparation, whether it is a mask set, direct-write instructions, or other lithographic representation, is used to pattern one or more material layers of a workpiece. FIGS. 5A and 5B show one such suitable workpiece 500. The exemplary workpiece includes a substrate 502 upon which other materials may be formed. The substrate 502 may be substantially similar to substrate 152 of FIGS. 1A-1I and/or 2A-2I and may include an elementary semiconductor, a compound semiconductor, a non-semiconductor material, and/or a combination thereof.

The substrate 502 may also include various material layers formed upon it. In the illustrated embodiment, the workpiece 500 includes a material layer 504 to be patterned and two hard mask layers (layer 506 and layer 508) disposed on the material layer. These may be substantially similar to those described in the context of FIGS. 1A-1I and/or 2A-2I. Of course, one of skill in the art will recognize that the substrate 502 may have any number of material layers and/or hard mask layers. Suitable materials for the material layers and hard mask layers may be selected based on etchant selectivity, and in various exemplary embodiments, material layer 504, hard mask layer 506, and hard mask layer 508 have different etchant selectivities such that each layer can be removed using a corresponding etchant without significant etching of the other layers. For example, various embodiments in which the patterning technique is used to pattern an inter-layer dielectric (ILD) in order to form an interconnect structure, material layer 504 includes a semiconductor and/or a dielectric material such as a semiconductor oxide, semiconductor nitride, and/or semiconductor oxynitride; hard mask layer 506 includes a different material having a different etchant selectivity such as a metal nitride (e.g., TiN, TaN, etc.), metal oxide, metal oxynitride, metal carbide, semiconductor, and/or dielectric; and hard mask layer 508 includes yet another material such as a different metal nitride, metal oxide, metal oxynitride, metal carbide, semiconductor, and/or dielectric. In one such embodiment, material layer 504 includes silicon oxynitride, hard mask layer 506 includes titanium nitride, and hard mask layer 508 includes amorphous silicon.

Workpiece 500 may also include a lithographically-sensitive resist 510 such as a photoresist and/or e-beam resist tailored to the particular technique and energy source used in the subsequent patterning steps. An exemplary resist 510 includes a photosensitive material that causes the material to undergo a property change when exposed to radiation. This property change can be used to selectively remove exposed (in the case of a positive tone resist) or unexposed (in the case of a negative tone resist) portions of the resist layer 510.

Referring to block 308 and to FIGS. 6A and 6B, a first patterning of the workpiece 500 is performed to form a first pattern in the resist layer 510. Patterning may be performed using any suitable lithographic technique including photolithography and/or direct-write lithography. An exemplary photolithographic patterning process includes soft baking of the resist layer 510, mask aligning, exposure, post-exposure baking, developing the resist layer 510, rinsing, and drying (e.g., hard baking). An exemplary direct-write patterning process includes scanning the surface of the resist layer 510 with an e-beam or other energy source while varying the intensity of the energy source in order to vary the dosage received by various regions of the resist layer 510. The pattern formed in the resist layer 510 by the first patterning of the workpiece 500 is based on the design database 400, and in particular on features 402 in group A. Specifically, in the illustrated embodiment, the patterned resist layer 510 covers each group B track, exposes each group C track that is not adjacent to a line-end linking feature 608 (explained in more detail below), and exposes those group A tracks in which a feature 402 is to be formed. Referring to FIG. 6A, tracks 404 have been superimposed on the workpiece 500 to mark the relative locations of these feature groups. In the illustrated embodiment, the edges of the pattern shape are located so that a spacer subsequently formed on the patterned hard mask layer 508 extends along those portions of the group C tracks that are not adjacent to a line-end linking feature 608. This becomes more evident in subsequent figures.

As can be seen, the pattern formed on the workpiece 500 is related to the features 402 of the design database 400 but also includes modifications made to the design database 400 in block 306. To further illustrate this point, two group A features to be formed are represented by dotted boxes 602. In the illustrated embodiment, the corresponding patterned area of the resist 510 is larger in a direction parallel to the respective track 404 and in a direction perpendicular to the respective track 404 as indicated by reference markers 604 and 606, respectively. The patterned area of the resist 510 also includes a line-end linking feature represented by dotted box 608. The line-end linking features 608 may be substantially similar to line-end linking features 162 of FIGS. 1A-1I and/or 2A-2I, and in that regard, line-end linking features 608 may be added between any two group A features spaced less than some minimum threshold apart. In the illustrated embodiment, the line-end linking feature region has a narrower width perpendicular to the track 404 than the feature region. These optical corrections (expanded feature area and line-end linking features 608) and others may be made to the design database 400 during the processing of block 306 or may be made to a mask or a set of direct-write instructions without updating the design database 400.

Referring to block 310 of FIG. 3 and to FIGS. 7A and 7B, the pattern of the resist 510 is transferred to the remainder of the workpiece 500 by any suitable etching process including wet etching, dry etching, reactive ion etching, ashing, and/or other suitable technique. The etching process and/or etching reagents may be selected to etch hard mask layer 508 without significant etching of hard mask layer 506. Any remaining resist 510 may be stripped following the patterning of hard mask layer 508.

Referring to block 312 of FIG. 3 and to FIGS. 8A and 8B, a first spacer 802 is formed on the sidewalls of the remaining hard mask layer 508. The first spacer 802 may include any suitable material (e.g., metal oxide, metal nitride, metal oxynitride, metal carbide, semiconductor, dielectric, etc.), which may be selected to have a different etchant selectivity than the surrounding layers (e.g., hard mask layer 508, hard mask layer 506, etc.). In an exemplary embodiment, the first spacer 802 includes TiO in order to differentiate it from an amorphous silicon hard mask layer 508 and a TiN-containing hard mask layer 506.

The material of the first spacer 802 may be deposited by any suitable process including atomic layer deposition (ALD), chemical vapor deposition (CVD), plasma-enhanced CVD (PE CVD), and/or other suitable deposition techniques. In one such embodiment, the material of the first spacer 802 is deposited conformally by ALD and an anisotropic (directional) etching technique such, as an anisotropic plasma etching, is performed to remove portions of the first spacer 802 deposited on horizontal surfaces of hard mask layer 508 and hard mask layer 506. In this way, only those portions of the first spacer 802 deposited on the vertical surfaces of hard mask layer 508 remain.

In other embodiments, the material of the first spacer 802 is deposited using a wet chemical reactant selected to react with hard mask layer 508 to produce a precipitate that forms the first spacer 802. The workpiece 500 may be rinsed to remove unreacted reactant and an anisotropic etching may be performed to remove portions of the first spacer 802 deposited on horizontal surfaces of hard mask layer 508 and hard mask layer 506.

Referring to block 314 of FIG. 3 and to FIGS. 9A and 9B, a second resist 902 (e.g., a photoresist, e-beam resist, etc.) is formed on the workpiece 500 and patterned to form a second pattern. The patterning may be performed by any suitable technique including photolithography and/or direct-write lithography and may be of a different type than the technique used to pattern the first resist layer 510. The pattern formed in the second resist layer 902 is based on the design database 400, and in particular on features 402 in group B. In the illustrated embodiment, the patterned resist layer 902 covers each group A track, exposes each group C track, and exposes those portions of group B tracks in which a feature 402 is to be formed.

Referring to block 316 of FIG. 3 and to FIGS. 10A and 10B, the pattern of the second resist 902 is transferred to the workpiece 500 by removing those portions of the hard mask layer 508 exposed by the second resist 902. The transfer may be achieved using any suitable etching process including wet etching, dry etching, reactive ion etching, ashing, and/or other suitable technique. The etching process and/or etching reagents may be selected to etch hard mask layer 508 without significant etching of hard mask layer 506 and/or the first spacer 802. Any remaining second resist 902 material may be stripped following the patterning of hard mask layer 508.

Referring to block 318 of FIG. 3 and to FIGS. 11A and 11B, a second spacer 1102 is formed on the sidewalls of the first spacer 802 and/or any remaining portion of hard mask layer 508. The second spacer 1102 may include any suitable material (e.g., metal oxide, metal nitride, metal oxynitride, metal carbide, semiconductor, dielectric, etc.), which may be selected to have a different etchant selectivity than the surrounding layers (e.g., hard mask layer 508, hard mask layer 506, first spacer 802, etc.). In an exemplary embodiment, the second spacer 1102 includes silicon dioxide in order to differentiate it from a TiO-containing first spacer 802, an amorphous silicon hard mask layer 508, and a TiN-containing hard mask layer 506.

Similar to the first spacer 802, the material of the second spacer 1102 may be deposited by any suitable process including atomic layer deposition (ALD), chemical vapor deposition (CVD), plasma-enhanced CVD (PE CVD), and/or other suitable deposition techniques. In one such embodiment, the material of the second spacer 1102 is deposited conformally by ALD and subsequently etched using an anisotropic (directional) etching technique to remove portions of the second spacer 1102 deposited on horizontal surfaces of hard mask layer 508, hard mask layer 506, and/or the first spacer 802. In this way, only those portions of the second spacer 1102 deposited on the vertical surfaces of the first spacer 802 and/or hard mask layer 508 remain.

In other embodiments, the material of the second spacer 1102 is deposited using a wet chemical reactant selected to react with the materials of the workpiece 500 to produce a precipitate that forms the second spacer 1102. The workpiece 500 may be rinsed to remove unreacted reactant and an anisotropic etching may be performed to remove portions of the second spacer 1102 deposited on horizontal surfaces of hard mask layer 508, hard mask layer 506, and/or the first spacer 802.

Referring to block 320 of FIG. 3 and to FIGS. 12A and 12B, a third resist 1202 (e.g., a photoresist, e-beam resist, etc.) is formed on the workpiece 500 and patterned to form a third pattern. The patterning may be performed by any suitable technique including photolithography and/or direct-write lithography and may be of a different type than the technique used to pattern the first resist layer 510 and the second resist layer 902. The pattern formed in the third resist 1202 is based on the design database 400, and in particular on features 402 in group C. In the illustrated embodiment, the patterned resist layer 1202 exposes those portions of group C tracks in which a feature 402 is to be formed.

Figure 13A:
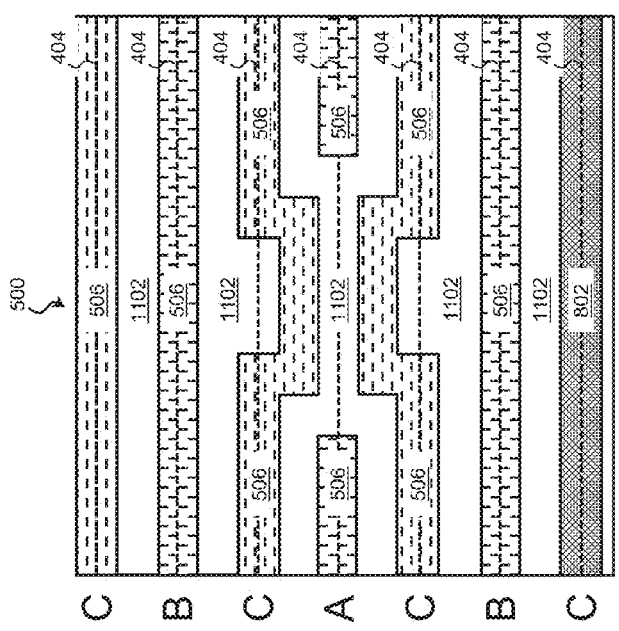
Figure 13B:
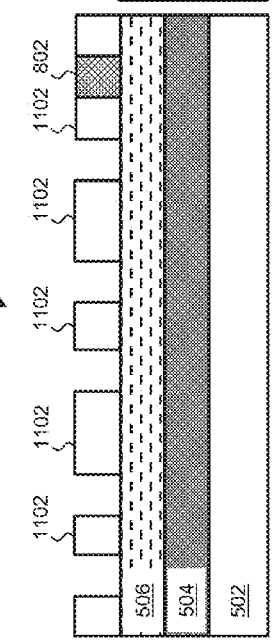

Referring to block 322 of FIG. 3 and to FIGS. 13A and 13B, the pattern of the third resist 1202 is transferred to the workpiece 500 by removing those portions of the first spacer 802 exposed by the third resist 1202. The transfer may be achieved using any suitable etching process including wet etching, dry etching, reactive ion etching, ashing, and/or other suitable technique. The etching process and/or etching reagents may be selected to etch the first spacer 802 without significant etching of the surrounding material layers including the second spacer 1102. Any remaining resist 1202 may be stripped following the patterning. At this point, the finished pattern has been defined by the remainder of the hard mask layer 508, first spacer 802, and/or second spacer 1102. The workpiece can be selectively processed using this pattern without any further patterning. However, in some embodiments, as part of this processing, the pattern is first transferred to another hard mask layer (e.g., hard mask layer 506).

Figure 14A:
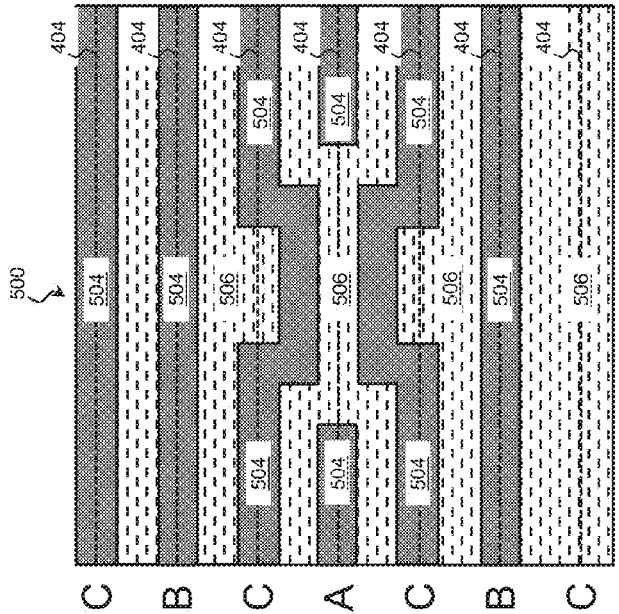
Figure 14B:
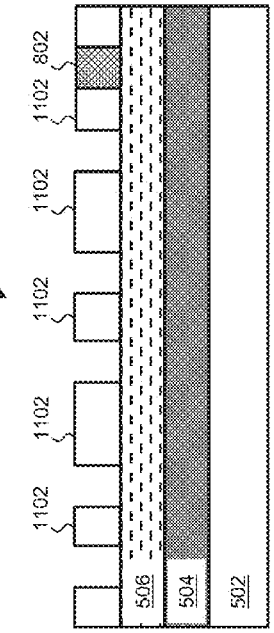

Accordingly, referring to block 324 of FIG. 3 and to FIGS. 14A and 14B, hard mask layer 506 is patterned using any remaining portions of hard mask layer 508, first spacer 802, and/or second spacer 1102. This patterning may be achieved using any suitable etching process including wet etching, dry etching, reactive ion etching, ashing, and/or other suitable technique. Following the patterning of the hard mask layer 506, the remaining portions of the hard mask layer 508, the first spacer 802, and/or the second spacer 1102 may be removed.

As can be seen from the preceding description, this patterning technique possesses several advantages not found in other multiple patterning techniques. For example, the line-end linking feature 608 (shown in FIG. 6A) allows for precise control of line-end spacing without a separate line-cut patterning step. Avoiding a line-cut patterning step may reduce the number of hard mask layers and may avoid the mask cost and time associated with the extra patterning step. Additionally, in some embodiments, this technique allows line-ends to be formed in the regions where they are not permitted in other techniques (e.g., between minimum-spaced group C features). Of course, these advantages are merely exemplary, and no advantage is required for any particular embodiment.

Using the technique of blocks 302-324, a pattern is formed in the hard mask layer 506 based on the three iterations of lithographic patterning in order to form a pattern specified in the design database 400. The hard mask layer 506 can then be used to selectively process the underlying substrate 502 and/or material layers (e.g., layer 504). The patterned hard mask layer 506 may be used in conjunction with any etching process, deposition process, implantation process, epitaxy process, and/or any other fabrication process. In some examples, described in the context of block 326 of FIG. 3 and FIGS. 15A and 15B, a material layer 504 is patterned using the hard mask layer 506 in order to form an interconnect structure. In so doing, the exposed portions of the material layer 504 are patterned using any suitable etching technique including dry etching, wet etching, reactive ion etching, ashing, and/or other suitable etching technique. After the etching, any remaining portion of the hard mask layer 506 may be removed.

Referring to block 328 and to FIGS. 16A and 16B, one or more layers of a conductive material 1602 are deposited on the patterned material layer 504 including within the etched portion. Suitable conductive materials 1602 include metals, metal oxides, metal nitrides, metal oxynitrides, metal carbides, and/or nonmetallic conductors, and in one such embodiment, the conductive material 1602 includes a TiN barrier layer disposed on the material layer 504 and a copper-containing fill material disposed on the barrier layer. Any portion of the conductive material 1602 extending above the material layer 504 may be removed using a chemical-mechanical polishing/planarization (CMP) process or other suitable technique.

FIG. 17 is an annotated scanning-electron microscope (SEM) image of a workpiece 500 having undergone the patterning method according to various aspects of the present disclosure. In the illustrated embodiments, there are some nonlinear feature portions, particularly in groups B and C, examples of which are indicated by reference markers 1702 and 1704. However, in many applications this non-linearity has minimal electrical and/or performance impact on the finished workpiece 500 and is an acceptable tradeoff for the benefits provided by the present technique such as the ability to form line-ends between minimally-spaced group C features without the burden of extra patterning steps.

Figure 18:
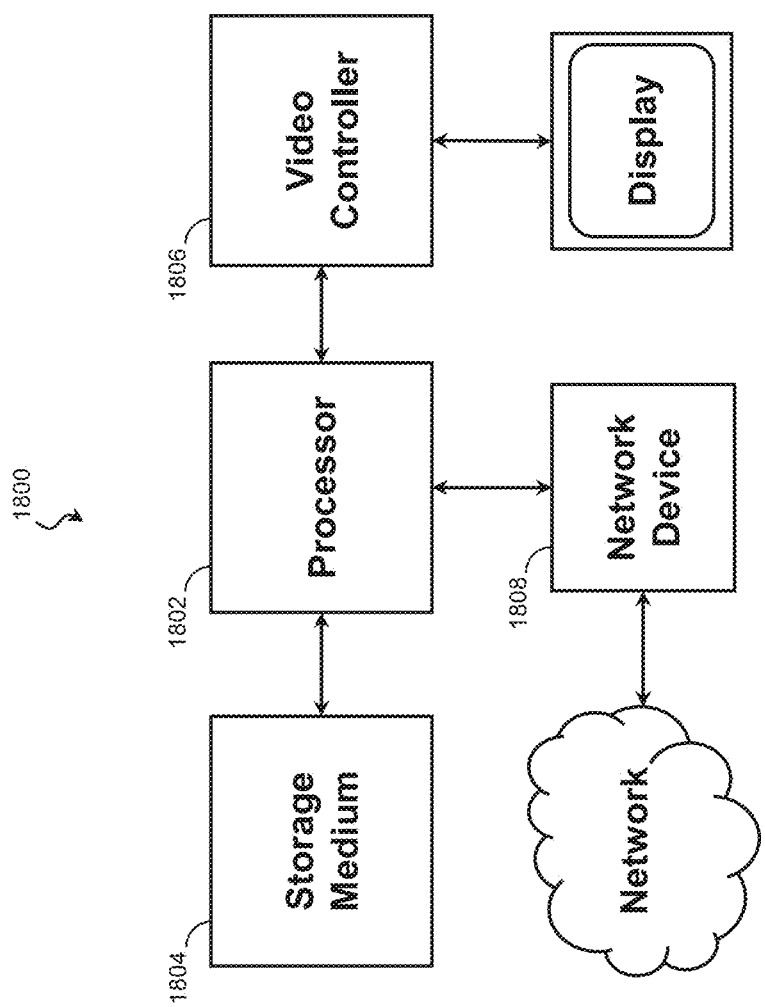
FIG. 18 is a system diagram of a computing system operable to perform the techniques of the present disclosure.

FIG. 18 is a system diagram of a computing system 1800 operable to perform the techniques of the present disclosure. The computing system 1800 may include a processor 1802 such as a microcontroller or a dedicated central processing unit (CPU), a non-transitory computer-readable storage medium 1804 (e.g., a hard drive, random access memory (RAM), a compact disk read only memory (CD-ROM), etc.), a video controller 1806 such as a graphics processing unit (GPU), and a network communication device 1808 such as an Ethernet controller or wireless communication controller. In that regard, in some embodiments, the computing system 1800 is programmable and is programmed to execute processes including those associated with grouping features, preparing a design database 400 for lithography, and patterning a workpiece 500 based on the design database 400. Accordingly, it is understood that any operation of the computing system 1800 according to the aspects of the present disclosure may be implemented by the computing system 1800 using corresponding instructions stored on or in a non-transitory computer readable medium accessible by the processing system. In that regard, the computing system 1800 is operable to perform one or more of the tasks described with respect to FIGS. 1A, 2A, and/or 3.

The present embodiments can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can store the program for use by or in connection with the instruction execution system, apparatus, or device. The medium may include non-volatile memory including magnetic storage, solid-state storage, optical storage, cache memory, Random Access Memory (RAM).

Thus, the present disclosure provides a technique for forming features on a workpiece that offers greater design flexibility and fewer design restrictions. In some embodiments, the provided method includes receiving a workpiece including a material layer and a hard mask material disposed thereupon. A lithographic patterning of the hard mask material is performed to define a recess therein. A spacer material is deposited within the recess of the patterned hard mask material to define at least two physically separated feature regions, and a portion of the workpiece is selectively processed based on a pattern defined by the patterned hard mask material and the spacer material within the recess. In some such embodiments, the depositing of the spacer material within the recess includes performing a substantially conformal deposition of the spacer material and performing an etching process configured to leave a portion of the spacer material on a side surface of the hard mask layer. In some such embodiments, the processing of the portion of the workpiece includes etching an exposed portion of the material layer based on the pattern and depositing a conductive material within the etched material layer.

In further embodiments, the provided method includes receiving a dataset specifying a plurality features to be formed on the workpiece. A first patterning of a hard mask of the workpiece is performed based on a first set of features of the plurality of features; and thereafter, a first spacer material is deposited on a sidewall of the patterned hard mask. A second patterning of the hard mask is performed based on a second set of features of the plurality of features; and thereafter, a second spacer material is deposited on a sidewall of the first spacer material. A third patterning of the workpiece is performed based on a third set of features of the plurality of features. A portion of the workpiece is selectively processed using a pattern defined by a remainder of at least one of the patterned hard mask layer, the first spacer material, or the second spacer material, the remainder remaining after the performing of the first patterning, the second patterning, and the third patterning. In one such embodiment, the performing of the first patterning includes forming a linking feature between a first feature region of the first set of features and a second feature region of the first set of features. The linking feature may have a width less than each of the first feature region and the second feature region.

In further embodiments, a method of patterning a material layer is provided. The method includes receiving a workpiece including the material layer and a hard mask layer. The hard mask layer is patterned according to a first set of features to be formed on the workpiece. A first spacing material is deposited on a side surface of the patterned hard mask layer, and thereafter the hard mask layer is patterned according to a second set of features to be formed on the workpiece. A second spacing material is deposited on at least one side surface of at least one of: the hard mask layer or the first spacing material. Thereafter, the first spacing material is patterned according to a third set of features to be formed on the workpiece. A pattern is transferred to the material layer, the pattern being defined by at least one of: the hard mask layer, the first spacing layer; or the second spacing layer. In some such embodiments, the patterning of the first spacing material is configured to avoid significant etching of an exposed portion of the second spacing material. In some such embodiments, the patterning of the hard mask layer according to the first set of features includes forming a linking feature between a first feature and a second feature, each of the first set of features.

In yet further embodiments, a method of semiconductor fabrication is provided that includes receiving a substrate having a material layer disposed thereupon and having a hard mask layer disposed on the material layer. A set of features to be formed in the material layer is identified. The features of the set of features are grouped according to tracks with which the features are aligned. The hard mask layer is patterned according to a first group of features of the set of features, and thereafter a first spacer material is deposited within the hard mask layer. The hard mask layer having the first spacer material deposited therein is patterned according to a second group of features of the set of features. A second spacer material is deposited that is different from the first spacer material within the hard mask layer. The first spacer material is patterned according to a third group of features of the set of features, and the material layer is patterned based on a pattern defined by at least one of: the hard mask layer, the first spacer material, or the second spacer material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a workpiece including a material layer and a hard mask material disposed thereupon;
   performing a lithographic patterning of the hard mask material to define a recess therein, wherein the patterned hard mask material further defines a linking feature;
   depositing a spacer within the recess of the patterned hard mask material to define at least two physically separated feature regions within the recess, wherein the linking feature is disposed between the at least two physically separated feature regions; and
   selectively processing a portion of the workpiece based on a pattern defined by the patterned hard mask material and the spacer within the recess.

2. The method of claim 1, wherein the depositing of the spacer within the recess includes performing a substantially conformal deposition of the spacer and performing an etching process configured to leave a portion of the spacer on a side surface of the hard mask material.

3. The method of claim 2, wherein the substantially conformal deposition includes an atomic layer deposition (ALD) process.

4. The method of claim 2, wherein the substantially conformal deposition includes exposing the hard mask material to a liquid reactant to deposit the spacer.

5. The method of claim 1, wherein the processing of the portion of the workpiece includes etching an exposed portion of the material layer based on the pattern.

6. The method of claim 5, wherein the processing of the portion of the workpiece further includes depositing a conductive material within the etched material layer.

7. A method of patterning a workpiece, the method comprising:
   receiving a dataset specifying a plurality features to be formed on the workpiece;
   performing a first patterning of a hard mask of the workpiece based on a first set of features of the plurality of features, wherein the first patterning defines at least an individual recess within the hard mask;
   thereafter depositing a first spacer material on a sidewall of the patterned hard mask within the individual recess;
   performing a second patterning of the hard mask based on a second set of features of the plurality of features;
   thereafter depositing a second spacer material on a sidewall of the first spacer material within the individual recess, to define at least two physically separated feature regions within the individual recess;
   performing a third patterning of the workpiece based on a third set of features of the plurality of features; and
   selectively processing a portion of the workpiece using a pattern defined by a remainder of at least one of the hard mask layer, the first spacer material, or the second spacer material, the remainder remaining after the performing of the first patterning, the second patterning, and the third patterning.

8. The method of claim 7, wherein the performing of the third patterning includes selectively removing an exposed portion of the first spacer material.

9. The method of claim 7, wherein the performing of the third patterning is configured to avoid significant etching of an exposed portion of the second spacer material.

10. The method of claim 7, wherein the performing of the first patterning includes forming a linking feature between a first feature region of the first set of features and a second feature region of the first set of features, and wherein the linking feature has a width less than each of the first feature region and the second feature region.

11. The method of claim 7, wherein the performing of the first patterning is configured such that the depositing of the first spacer material deposits the first spacer material within a region corresponding to the third set of features.

12. The method of claim 11, wherein the performing of the first patterning is configured such that the depositing of the first spacer material deposits the first spacer material within each track corresponding to the third set of features that is not adjacent a feature linking two features of the first set of features.

13. The method of claim 7, wherein the third set of features have a track pitch within the set that is different from a track pitch within the first set of features and a track pitch within the second set of features.

14. The method of claim 13, wherein the track pitch within the third set of features is about half as large as the track pitch within the first set and the track pitch within the second set.

15. The method of claim 7, wherein the processing of the portion of the workpiece includes patterning another hard mask layer that is different from the patterned hard mask layer based on the pattern defined by the remainder.

16. A method of patterning a material layer, the method comprising:

receiving a workpiece including the material layer and a hard mask layer;

patterning the hard mask layer according to a first set of features to be formed on the workpiece, wherein the patterning defines a recess in the hard mask layer;

depositing a first spacing material on a side surface of the patterned hard mask layer within the recess;

thereafter patterning the hard mask layer according to a second set of features to be formed on the workpiece;

depositing a second spacing material on at least one side surface of the first spacing material within the individual recess, to define at least two physically separated feature regions within the recess;

thereafter patterning the first spacing material according to a third set of features to be formed on the workpiece; and transferring to the material layer a pattern defined by at least one of: the hard mask layer, the first spacing layer; or the second spacing layer.

17. The method of claim 16, wherein the patterning of the first spacing material is configured to avoid significant etching of an exposed portion of the second spacing material.

18. The method of claim 16, wherein the patterning of the hard mask layer according to the first set of features includes forming a linking feature between a first feature and a second feature, each of the first set of features.

19. The method of claim 18, wherein the linking feature has a width that is less than a width of a region associated with the first feature and less than a width of a region associated with the second feature.

20. The method of claim 16, wherein the patterning of the hard mask layer according to the first set of features is configured such that the depositing of the first spacing material deposits the first spacing material within a region corresponding to the third set of features.

\* \* \* \* \*